(12) United States Patent
Goyal

(10) Patent No.: US 8,536,098 B2
(45) Date of Patent: Sep. 17, 2013

(54) HIGH PERFORMANCE SUPERCONDUCTING DEVICES ENABLED BY THREE DIMENSIONALLY ORDERED NANODOTS AND/OR NANORODS

(76) Inventor: Amit Goyal, Knoxville, TN (US)

( * ) Notice: Subject to any disclaimer, the term of this patent is extended or adjusted under 35 U.S.C. 154(b) by 43 days.

(21) Appl. No.: 13/136,357

(22) Filed: Jul. 30, 2011

(65) Prior Publication Data
US 2011/0287939 A1    Nov. 24, 2011

Related U.S. Application Data

(60) Continuation-in-part of application No. 11/498,120, filed on Aug. 3, 2006, now Pat. No. 8,119,571, and a division of application No. 12/077,923, filed on Mar. 24, 2008, now Pat. No. 8,034,745.

(51) Int. Cl.
*H01L 39/24* (2006.01)

(52) U.S. Cl.
USPC .......... 505/238; 505/126; 505/237; 505/320; 505/704; 428/472; 428/701; 252/519.15; 252/519.12

(58) Field of Classification Search
USPC .................. 505/126, 150, 236–238, 470, 731, 505/779, 780, 785; 428/457, 472, 701, 702; 427/597
See application file for complete search history.

(56) References Cited

PUBLICATIONS

Goyal et al, "Irradiation-free, columnar defects comprised of self-assembled nanodots and nanorods resulting in strongly enhanced flux-pinning in YBa2Cu3O7-δ films," Supercond. Sci. Technol. 18 (2005) 1533-1538.*
Yamada et al, "Epitaxial nanostructure and defects effective for pinning in Y(RE)Ba2Cu3O7-x coated conductors," Applied Physics Letters 87, 132502 2005.*
Wong-Ng et al., Journal to Research of the National Institute of Standards and Technology, 106, 1097-1134, 2001.
Haugan et al., Nature, vol. 430, pp. 867-870, 2004.

* cited by examiner

*Primary Examiner* — Stanley Silverman
*Assistant Examiner* — Kallambella Vijayakumar

(57) ABSTRACT

Novel articles and methods to fabricate same with self-assembled nanodots and/or nanorods of a single or multicomponent material within another single or multicomponent material for use in electrical, electronic, magnetic, electromagnetic and electrooptical devices is disclosed. Self-assembled nanodots and/or nanorods are ordered arrays wherein ordering occurs due to strain minimization during growth of the materials. A simple method to accomplish this when depositing in-situ films is also disclosed. Device applications of resulting materials are in areas of superconductivity, photovoltaics, ferroelectrics, magnetoresistance, high density storage, solid state lighting, non-volatile memory, photoluminescence, thermoelectrics and in quantum dot lasers.

30 Claims, 17 Drawing Sheets

HIGH PERFORMANCE SUPERCONDUCTING DEVICES ENABLED BY THREE DIMENSIONALLY ORDERED NANODOTS AND/OR NANORODS

CROSS-REFERENCE TO RELATED APPLICATIONS

This application is a continuation-in-part of U.S. patent application Ser. No. 11/498,120 now U.S. Pat. No. 8,119,571 filed Aug. 2, 2006 and divisional of U.S. patent application Ser. No. 12/077,923 now U.S. Pat. No. 8,034,745 filed Mar. 24, 2008.

STATEMENT REGARDING FEDERALLY FUNDED RESEARCH OR DEVELOPMENT

This invention was made with Government support under Contract No. DE-AC05-000R22725 awarded by the United States Department of Energy. The Government has certain rights in this invention.

FIELD OF THE INVENTION

The invention relates to fabrication of high performance electrical, electronic, magnetic or electromagnetic composite device layers with ordered nanodots and nanorods of another compound and articles made therefrom.

BACKGROUND OF THE INVENTION

Nano-sized materials may constitute key elements for advanced functional devices due to their size sensitive electrical, optical, magnetic and chemical properties. To integrate nano-structures into real devices, it is desirable to form them with controlled size and distribution on substrates compatible with current fabrication technologies. As an example, magnetic recording technology has been driven by a strong demand for faster access speeds and for higher data storage density. To meet this demand, the areal density (i.e. the number of bits that can be stored per unit area) of magnetic hard disk data storage devices has been increasing rapidly year on year since 1991. It has been predicted that current media will encounter a physical limit which will prevent, or at least make very difficult, the manufacture of high-density magnetic storage media with an areal density of over 200-300 Gbit/in 2. Currently used thin film magnetic recording media typically consist of a plurality of small, single-domain magnetic grains, which are magnetically isolated from one another. For an acceptable media signal-to-noise ratio, each recording bit must contain a number of magnetic grains. Typically several tens to several hundreds of magnetic grains in each written bit are used, with each grain having a diameter in the range of 10-20 nm or so. To increase the storage density beyond that provided by these current media, the size of the multigrain bits (and therefore each grain in each bit) must be reduced yet further. However, if the grain size is too small, the magnetization applied to the bit cannot be retained against thermal decay due to the very small energy barrier height. As a consequence, applied magnetization would be able to switch easily, and thus recorded data could be lost. To avoid this limit it is desired to use patterned media in high-density magnetic storage media with an areal density of from 100 Gbit/in. 2 to tens of Tbit/in. 2. Patterned media, in which each bit has several grains, help control thermal stability because the volume of a whole bit can be much larger than the volume of a single grain. Larger bits can be strongly exchange-coupled, more clearly defined and less likely to flip their magnetic state.

However, no method exists which can readily produce three dimensionally ordered bits and hence these have yet to be shown possible.

When the size of magnetic particles is reduced to a few tens of nanometers, they exhibit a number of outstanding physical properties such as giant magnetoresistance, superparamagnetism, large coercivities, high Curie temperature and low magnetization saturation as compared to corresponding bulk values. Due to the realization of these outstanding physical properties upon size reduction, self-assembled magnetic nanodots and nanorods within a crystalline, matrix of another composition could bring out revolutionary advances in applications.

Semiconductor lasers are key components in a host of widely used technological products, including compact disk players and laser printers, and they will play critical roles in optical communication schemes. The basis of laser operation depends on the creation of nonequilibrium populations of electrons and holes, and coupling of electrons and holes to an optical field, which will stimulate radiative emission. It has been predicted that there are many advantages of using quantum wells as the active layer in such lasers. The ensuing carrier confinement and nature of the electronic density of states should result in more efficient devices operating at lower threshold currents than lasers with bulk active layers. In addition, the use of a quantum well, with discrete transition energy levels dependent on the quantum well dimensions (thickness), provides a means of "tuning" the resulting wavelength of the material. The critical feature size-in this case, the thickness of the quantum well-depends on the desired spacing between energy levels. Even greater benefits have been predicted for lasers with quantum dot active layers. It was also predicted in the early 1980s that quantum dot lasers should exhibit performance that is less temperature-dependent than existing semiconductor lasers, and that will in particular not degrade at elevated temperatures. Other benefits of quantum dot active layers include further reduction in threshold currents and an increase in differential gain—that is, more efficient laser operation. However, a broad distribution of sizes "smears" the density of states, producing behavior similar to that of bulk material. Thus, the challenge in realizing quantum dot lasers with operation significantly superior to that shown by quantum well lasers is that of forming high quality, uniform quantum dots in the active layer. Once again, self-assembled nanodots within a crystalline, matrix of another composition will behave as ordered quantum dots and could bring out revolutionary advances in these applications. Magnetic oxide perovskites are well known due to the phenomenon of colossal magnetoresistance found in these materials. The 100% spin-polarization of half-metallic magnetic perovskites and the ability to epitaxially incorporate them into single crystal all-oxide heterostructures are important in spintronics applications. Neither has three dimensional ordering of such complex oxide ceramic materials been demonstrated in nano-size, nor has their incorporation into a crystallographically single crystal matrix.

For electronic devices, an ordered array of three dimensional nanodots and nanorods promises to extend device physics to full two- or three-dimensional confinement (quantum wires and dots). Multidimensional confinement in these low dimensional structures has long been predicted to alter significantly the transport and optical properties, compared to bulk or planar heterostructures. More recently, the effect of charge quantization on transport in small semiconductor quantum dots has stimulated much research in single-electron devices, in which the transfer of a single electron is sufficient to control the device. The most important factor driving active research in quantum effect is the rapidly expanding semiconductor band-gap engineering capability provided by modern epitaxy. Possible applications include spin transistors and single electron transistors. Other possible applications of three dimensionally ordered nanodots and nanorods include potential applications in optoelectronics and sensors. For example, an array of luminescent ordered nanodots within a transparent matrix can be used for devices using the photoluminescence effect.

The development of biaxially textured, second-generation, high temperature superconducting (HTS) wires is expected to enable most large-scale applications of HTS materials, in particular electric-power applications. Second-generation HTS conductors or "coated-conductors" comprise a flexible metallic substrate upon which several buffer layers and then the superconducting layer is deposited. The key goal is to have a biaxially textured superconducting layer so that few high-angle, weakly conducting grain boundaries are present. This is accomplished by epitaxial formation of the superconducting layer on biaxially textured oxide surfaces deposited upon the flexible metallic substrate. Three techniques have been developed to accomplish this—ion-beam assisted deposition (IBAD) of biaxially textured buffers on polycrystalline alloy substrates, epitaxial deposition of buffer multilayers on rolling assisted, biaxially textured substrates (RABiTS), and inclined substrate deposition (ISD) of buffers on polycrystalline alloy substrates. For epitaxial YBCO on substrates fabricated using all three techniques, the "inter-granular" critical current density is enhanced due to suppression of weak-links at grain boundaries.

However, for practical application of HTS materials, the in-field performance or the "intra-granular" critical current density, also needs to be enhanced further. For many potential applications, high critical currents in applied magnetic fields are required. This is especially so for electric power applications of HTS materials as well as for military applications. For example, the underground transmission cable application requires critical current per unit width, I c, greater than 300 A/cm in self-field; for military applications, an I c greater than 100 A/cm and an engineering critical current density, J E, greater than 15 kA/cm 2 at 65 K, 3 T and at all applied field orientations, is required; and for rotating machinery such as motors and generators, a J E of 30-40 kA/cm 2 at 55-65 K, in operating fields of 3-5 T, and at all applied field orientations, is required. The phrase "total engineering critical density" is implied to include the thickness of the stabilizer layer as well.

It is well known that defects within superconducting materials can pin the magnetic flux lines so that large currents can flow through the materials in the presence of high applied magnetic fields. However, in order for the defects to be effective in pinning the flux, their size, density and geometry needs to be appropriate. Defects such as oxygen vacancies, twin boundaries, and dislocations form naturally inside films and act as pinning centers. However, the density of these naturally formed defects is not high enough to provide the necessary performance requirements for the various applications in question. To increase the density of defects for effective pinning, there have been extensive studies on introducing artificial pinning defects. Among these, linear defects such as the columnar defects produced via heavy ion irradiation have proved to be the most effective. Such columnar defects can be generated by irradiating high temperature superconducting materials with heavy-ions significantly enhance the in-field critical current density. These columnar defects leave amorphized damage tracks in the superconductor. Hence, for over a decade scientists world-wide have sought means to produce such columnar defects in HTS materials without the expense and complexity of ionizing radiation. This approach, however, is not practical for scale-up as it is not only too expensive but can render the metallic substrate radioactive.

Many electrical, electronic, optical, magnetic, electromagnetic and electro-optical devices require single crystal-like device layers with few defects within the device layer. This can be accomplished by epitaxial growth of these devices on lattice-matched, single crystal substrates. These substrates however cannot be fabricated in long lengths or in large area and essentially limited to sizes of about a foot in length and diameter at best. Hence, a variety of artificially fabricated, single crystal substrates have been developed. Among them, an important class of substrates is known as rolling assisted, biaxially textured substrates (RABiTS). Biaxial texture in a substrate refers to situation when all the grains in a polycrystalline substrate are aligned within a certain angular range with respect to one another. A polycrystalline material having biaxial texture of sufficient quality for electromagnetic applications can be generally defined as being characterized by an x-ray diffraction phi scan peak of no more than 20° full-width-half-maximum (FWHM) and a omega-scan of 10° FWHM. The X-ray phi-scan and omega-scan measure the degree of in-plane and out-of-plane texture respectively. An example of biaxial texture is the cube texture with orientation {100}<100>, wherein the (100) crystallographic plane of all grains is parallel to the substrate surface and the [100] crystallographic direction is aligned along the substrate length. Other suitable definitions have also been set forth in varying terms. It is helpful to review some of the prior work that the present invention builds upon. The entire disclosure of each of the following U.S. patents is incorporated herein by reference: U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; 7,087,113. Moreover, there are other known routes to fabrication of biaxially textured, flexible electromagnetic devices known as ion-beam-assisted deposition (IBAD) and inclined-substrate deposition (ISD). IBAD processes are described in U.S. Pat. Nos. 6,632,539, 6,214,772, 5,650,378, 5,872,080, 5,432,151, 6,361,598, 5,872,080, 6,756,139, 6,884,527, 6,899,928, 6,921,741 and these show that a {100}<100>, cube-textured surfaces can be obtained using this process; ISD processes are described in U.S. Pat. Nos. 6,190,752 and 6,265,353; all these patents are incorporated herein by reference. In the ISD process, the resulting substrate has rotated cube texture and the rotation can be as high as 40-45°. In the IBAD and ISD processes a flexible, polycrystalline, untextured substrate is used and then a biaxially textured layer is deposited on this substrate.

Large-area and flexible single crystal substrates have also been fabricated as reported in U.S. Pat. No. 7,087,113 by Goyal. This patent is also incorporated herein by reference.

SUMMARY OF THE INVENTION

In accordance with one aspect of the present invention, the foregoing and other objects are achieved by fabrication of self-assembled, crystalline nanodots and nanorods of a certain composition within a crystalline matrix of another phase. As used herein, the phrase "self-assembled" is defined herein to mean a self-ordering process wherein the ordering occurs naturally during growth of the composite material or film. In particular, the invention enables fabrication of high performance and novel, electrical, magnetic, electromagnetic and electrooptical devices via epitaxial deposition on single crystal and/or single crystal-like, biaxially textured substrates by incorporation of self-assembled nanodots and nanorods of a second phase material within a device layer.

In accordance with another aspect of the present invention, the foregoing and other objects are achieved by fabrication of a flexible, polycrystalline, REBCO-type, high-temperature superconducting tape with an orientation of {100}<100> or rotated {100}<100>, consisting of at least one superconducting layer having non-randomly dispersed, crystalline, epitaxial columns of nanodots and/or nanorods of a non-superconducting material, aligned preferentially along the c-axis of the superconductor, with the diameter of nanodots and/or nanorods being in the range of 2-100 nanometers.

In a preferred embodiment, over 80% of the non-superconducting nanodots and/or nanorods are aligned within 60 degrees from the c-axis of superconductor.

In a another preferred embodiment, additional defects perpendicular to the c-axis of the superconductor selected from a group comprising of aligned second phase particles and stacking faults are present.

In another preferred embodiment, the said non-superconducting material is present only as continuous nanorods, which are preferentially aligned along the c-axis of the superconductor.

It is desired that the non-superconducting material within the superconductor layer has a lattice parameter mismatch is greater than 3% with superconducting layer, and preferably greater than or equal to 8%. The non-superconducting material within the superconductor layer is an oxide having a crystal structure selected from a group comprising a perovskite, rock-salt, pyrochlore or fluorite structure. In a preferred embodiment the non-superconducting material within the superconductor layer has a chemical formula of $BaMO_3$, where M is selected from a group comprising Ti, Zr, Al, Hf, Ir, Sn, Nb, Mo, Ta, Ce, V. In yet another preferred embodiment, the non-superconducting material is a Barium containing material, selected from a group comprising Barium Zirconate, Barium Titanate, Barium Stanate, Barium Hafnate, Barium Iridium Oxide, Barium Niobate, Barium Aluminate, Barium Cerate, Barium Molybdate, Barium Vanadate and Barium Tungstate.

In yet another embodiment, at least a portion of the said non-superconducting material within the superconducting layer is randomly or non-epitaxially oriented with respect to the superconductor layer.

The REBCO superconducting film corresponds to $RE\ 0.8\text{-}2.0\ Ba\ 1.5\text{-}2.5\ Cu\ 2.5\text{-}3.5\ O_x$, where RE is selected from a group comprising of Y, Pr, Nd, Gd, Sm, Er, Eu, Pm, Dy, Ho, Tb, Tm or Lu and their mixtures thereof. In a preferred embodiment, the superconducting film has an orientation of {100}<100> or a rotated {100}<100>, with a rotation of less than or equal 45 degrees. It is desired that the superconducting layer is capable of carrying supercurrents in excess of 200 Amperes at 65K, in an applied magnetic field of 3 T, and in all applied field orientations. It is also desired that the superconducting layer has a total engineering critical current density in excess of 20,000 Amperes/cm$^2$ at 65K, in an applied magnetic field of 3 T, and in all applied field orientations.

Preferably, the superconductor is grown epitaxially on a biaxially textured substrate selected from a group comprising of single crystal substrates, IBAD textured substrates, ISD textured substrates and thermomechanically textured substrates.

In a preferred embodiment, the superconducting film of overall composition $RE\ 0.8\text{-}2.0\ Ba\ 1.5\text{-}2.5\ M\ 0.01\text{-}0.2\ Cu\ 2.5\text{-}3.5\ O_x$, where M is selected from Ti, Zr, Al, Hf, Ir, Sn, Nb, Mo, Ta, Ce, V and RE is selected from Pr, Nd, Gd, Sm, Er, Eu, Pm, Dy, Ho, Tb, Tm or Lu. In a further preferred embodiment, M is Zr or Sn.

The invention teaches a method of forming a flexible, polycrystalline, biaxially textured, REBCO-type, high-temperature superconducting tape consisting of at least one superconducting layer and comprising the steps of: (A) providing a flexible, polycrystalline, biaxially textured substrate with a surface suitable for epitaxial growth of the superconductor, (B) heating the substrate to a preselected temperature suitable for epitaxial growth of the superconductor, (C) in-situ, epitaxially depositing a composite superconductor film from mixed precursor materials at a preselected atmosphere on the biaxially textured substrate, resulting in a film having epitaxial columns of crystalline nanodots and/or nanorods of a non-superconducting material aligned preferentially along the c-axis of the superconductor, with the diameter of nanodots and/or nanorods being in the range of 2-100 nanometers in the as-formed state. It is preferred that the superconducting film is deposited using a technique selected from a group comprising pulsed laser ablation (PLD), chemical vapor deposition (CVD), molecular chemical vapor deposition (MOCVD), direct current (DC) or radio-frequency (rf) sputtering, electron beam co-evaporation, thermal co-evaporation, chemical solution deposition and pulsed electron deposition (PED).

In a preferred embodiment, the REBCO superconducting layer corresponds to $REBa_2Cu_3O_{7-\delta}$, where RE is selected from a group comprising of Y, Pr, Nd, Gd, Sm, Er, Eu, Pm, Dy, Ho, Tb, Tm or Lu and their mixtures thereof.

Another embodiment of this invention teaches a biaxially textured, electrical, electronic, magnetic, electromagnetic or electrooptical device consisting of at least one device layer having non-randomly dispersed, crystalline, epitaxial columns of nanodots and/or nanorods of a another material, aligned preferentially within the device layer, with the diameter of nanodots and/or nanorods being in the range of 2-100 nanometers, said device layer being multicomponent or containing more than one cation. The said device layer can be used for an application selected from a group comprising of photovoltaic devices, ferroelectric devices, light emitting diodes for solid state lighting applications, storage applications such as computer hard disc drives, magnetoresistance based devices, photoluminescence based devices, non-volatile memory applications, dielectric devices, thermoelectric devices, quantum dot laser applications and high temperature superconductivity based devices.

BRIEF DESCRIPTION OF THE DRAWINGS

A fuller understanding of the present invention and the features and benefits thereof will be accomplished upon review of the following detailed description together with the accompanying drawings, in which.

Figure 1:
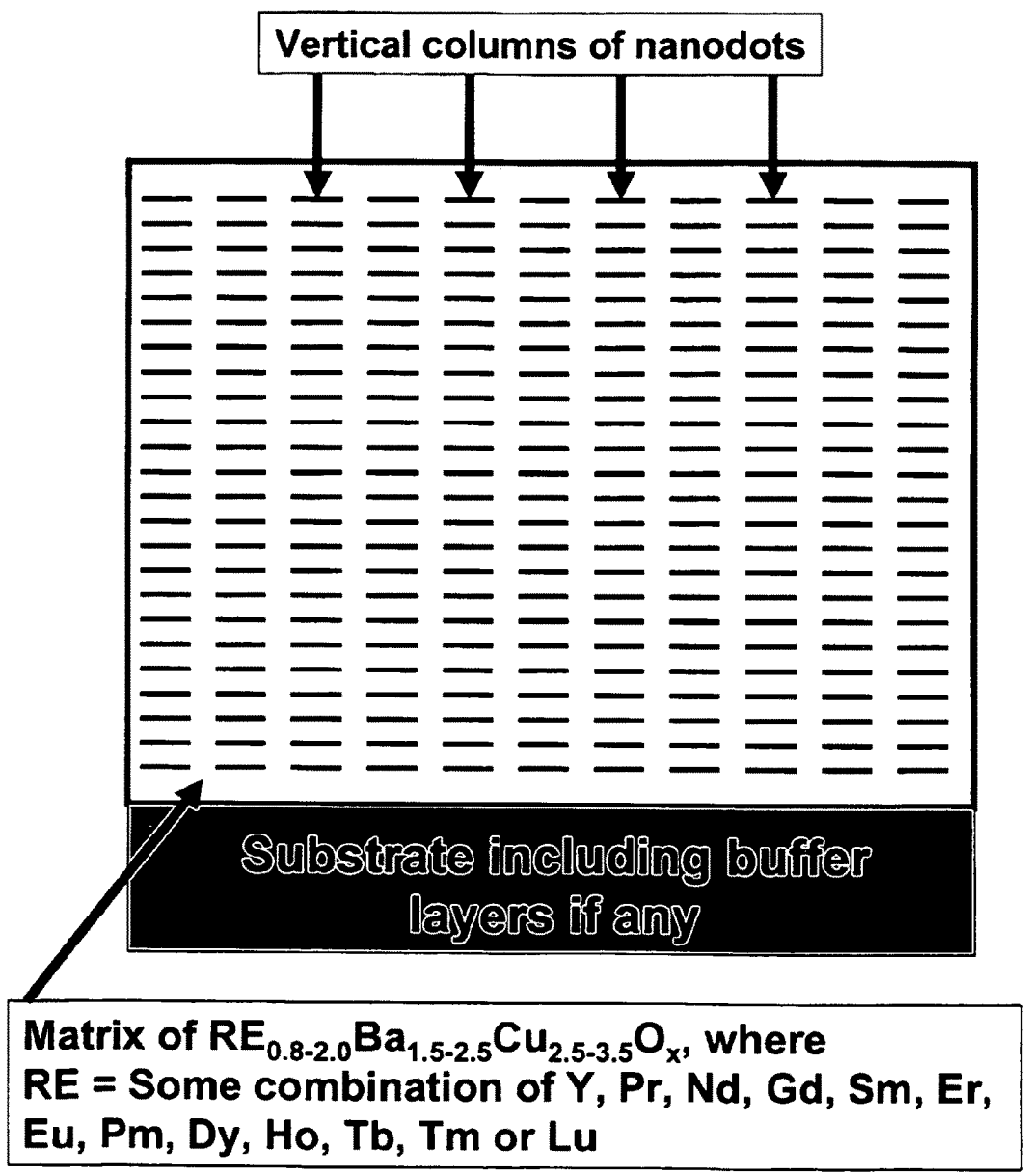
FIG. 1 shows an idealized schematic representation in cross-section of self-assembled or ordered nanodots within a superconducting device layer grown epitaxially on a substrate. In this case the ordering of nanodots occurs such that vertical columns of nanodots are formed.

For a better understanding of the present invention, together with other and further objects, advantages and capabilities thereof, reference is made to the following disclosure and appended claims in connection with the above-described drawings.

DETAILED DESCRIPTION OF THE PREFERRED EMBODIMENTS

Fabrication of a device layer or film in an epitaxial manner on a substrate is commonly performed in the electronic industry for many applications such as those involving superconductors, semiconductors, magnetic materials, electromagnetic and electro-optical materials. In many of these applications, the performance of device layer can be significantly improved or enhanced via incorporation of an ordered array of nanodots, nanorods or nanoparticles second phase material. In other cases, incorporation of an ordered array of nanodots, nanorods or nanoparticles second phase material, can result in new and novel properties not possible otherwise. Also, in many of these applications, large-area and long device layers are required. This can be accomplished by epitaxial growth of device layers containing ordered array of nanodots, nanorods or nanoparticles second phase material on biaxially textured substrates. For example, in the field of high temperature superconductors, metallic tapes can be used to form epitaxial superconducting layers having long (km) lengths, for applications such as for low-loss electrical power lines, by epitaxial growth on artificially fabricated, biaxially textured substrates. Artificially fabricated biaxially textured substrates can be fabricated using by thermomechanical texturing, by ion-beam assisted deposition or by inclined substrate deposition (the patents incorporated by reference as specified before teach how to fabricate such substrates). All of these substrates are flexible and epitaxial devices grown on such substrates are also flexible. "Flexible" as used herein refers to the ability to bend the device around a 12 inch mandrel without degradation of device electronic properties.

In a preferred embodiment of the invention, self-assembled nanodots of a second phase material are incorporated during growth of the device layer. This can be done using many in-situ deposition techniques wherein the deposition of the film is done at elevated temperatures. In-situ film deposition techniques include pulsed laser ablation (PLD), chemical vapor deposition (CVD), molecular chemical vapor deposition (MOCVD), direct current (DC) or radio-frequency (rf) sputtering, electron beam co-evaporation, thermal co-evaporation or pulsed electron deposition (PED). The self-assembled nanodots and/or nanorods of second phase material form due to misfit strain between the second phase and the matrix film. When the lattice parameter of the growing epitaxial film is different from that of the second phase material, a lattice mismatch occurs resulting in misfit strains. Nanodots and/or nanorods self-assemble themselves to minimize the strain and hence the energy of the composite film. Specific deposition conditions used during film growth as well as the composition or volume fraction of second phase incorporated, control the size, shape and orientation of the nanodots and/or nanorods. It is preferred to have a lattice mismatch between the film matrix and the material comprising the nanodots and/or nanorods to be greater than 3%. At this lattice mismatch and beyond, significant strains result and result in well-defined ordering of nanodots and nanorods.

Moreover, the ability to incorporate such self-assembled nanodots and/or nanorods of second phase material within a device layer while performing a single or simultaneous deposition is another important benefit of this invention. This significantly reduces the complexity of fabricating such novel device layers. Specific realization of this invention was demonstrated for a high temperature superconducting film of composition $YBa_2Cu_3O$ (YBCO) in which second phase nanodots and nanorods of composition $BaZrO_3$ (BZO) were incorporated during simultaneous deposition using PLD from a single target containing a mixture of YBCO and nanopowder of BZO. The PLD target was prepared by mechanically mixing pre-formed YBCO micron-sized powder with commercial BZO nanopowder, followed by cold pressing and sintering to form a target. Films were grown on a single crystal-like, biaxially textured substrate fabricated by thermomechanical processing and of composition Ni-3 at % W or Ni-5 at % W. Prior to the growth of the composite device layer, epitaxial multi-layers of buffer layers of $Y_2O_3$, yttria stabilized zirconia (YSZ) and $CeO_2$ were deposited on the metallic alloy substrate. The substrates were mounted on a heater block and the assembly was heated to a predetermined deposition temperature. The optimal temperature of film growth was determined by routine experimentation. The optimal distance between the target used for PLD and the substrate on which the film was deposited was also determined via routine experimentation. The background gas pressure used during the deposition so as to be in a regime wherein both the YBCO and BZO are stable was also determined by routine experimentation. Growth of such composite films containing self-assembled nanodots and/or nanorods can be performed on any single crystal substrate or on any biaxially textured substrate fabricated using thermomechanical texturing (rolling assisted biaxially textured substrates (RABiTS), ion-beam assisted deposition (IBAD) or using inclined substrate deposition (ISD). Since the RABiTS, IBAD and ISD substrates as well as single crystal substrates described in U.S. Pat. No. 7,087,113 by Goyal et al. can be fabricated in long lengths and in wide configurations, reel-to-reel fabrication of novel device layers with composite films containing self-assembled nanodots and/or nanorods can be fabricated. Lengths up to 1000 meters and widths up to several meters should be possible.

Example 1

Self-assembled nanodots and nanorods of non-superconducting phases were incorporated by performing laser ablation from a single target comprising a mixture of YBCO powder and nanoparticles of the chosen non-superconducting phase. Nanoparticles of materials such as BZO, $CaZrO_3$ (CZO), YSZ, $Ba_xSr_{1-x}TiO_3$ (BST), etc. are commercially available from vendors such as Sigma-Aldrich. These nanoparticles, with a sharp particle size distribution ranging from 10-100 nm, are well-mixed with YBCO powder, via mechanical mixing, then cold pressed to form a green target. The target was then sintered at 950° C. in flowing oxygen. The target is then mounted on the target holder in the pulsed laser deposition (PLD) experimental setup. Depositions were performed on the technically important rolling-assisted-biaxially-textured-substrates (RABiTS) substrates with the configuration Ni-5 at % W (50 μm)/Y 2 O 3 (75 nm)/YSZ (75 nm)/CeO 2 (75 nm). PLD depositions were performed using a XeCl (308 nm) excimer laser, LPX 305 at a repetition rate of 10 Hz, substrate deposition temperature of 790° C. and an oxygen partial pressure of 120 mTorr. The transport critical current density (J c) was measured using the standard four-point probe method using a voltage criterion of 1 μV/cm.

Figure 2:
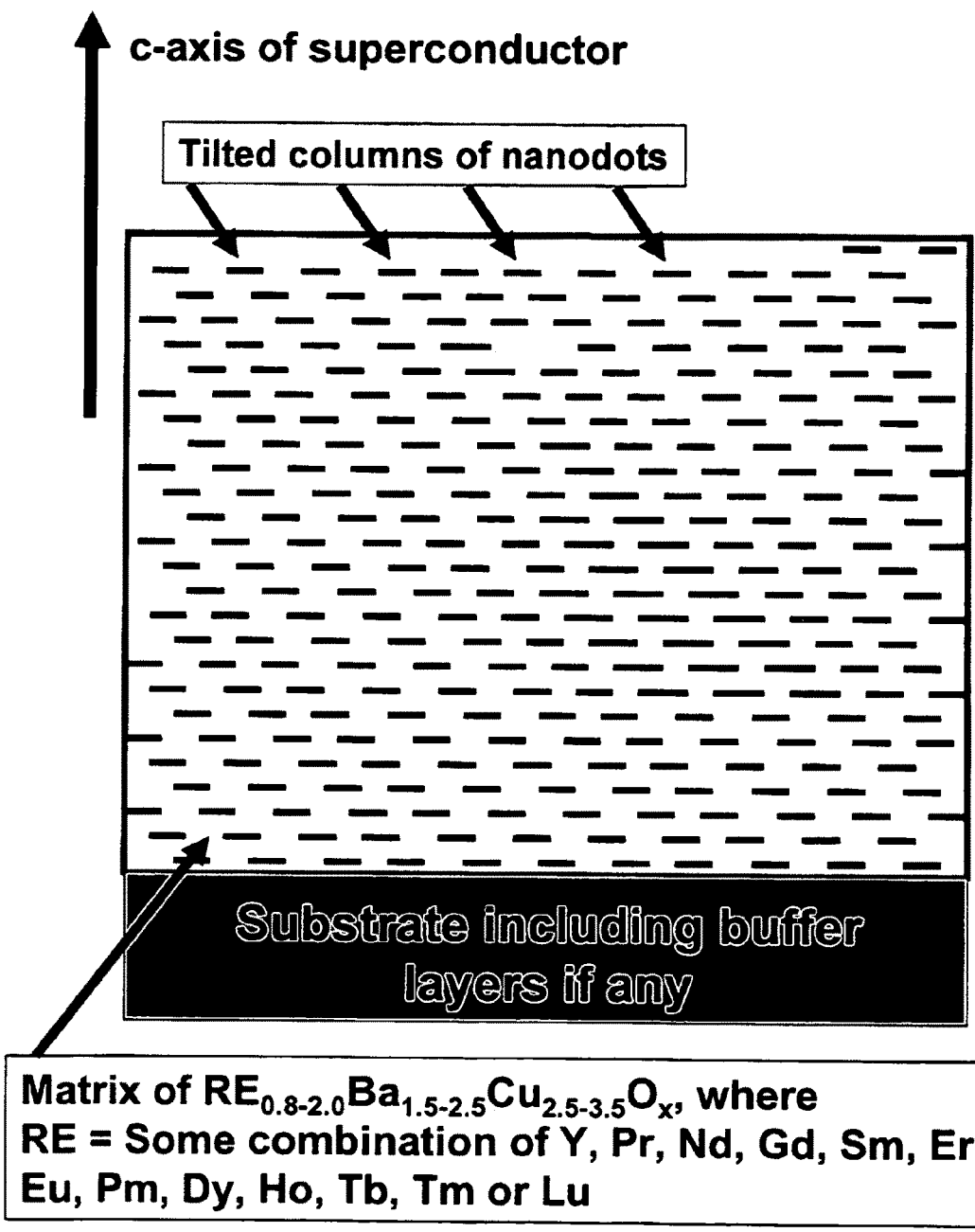
FIG. 2 shows an idealized schematic representation in cross-section of self-assembled or ordered nanodots within a superconducting device layer grown epitaxially on a substrate. In this case the ordering of nanodots can occur in a manner so as to form tilted columns of nandots.
Figure 3:
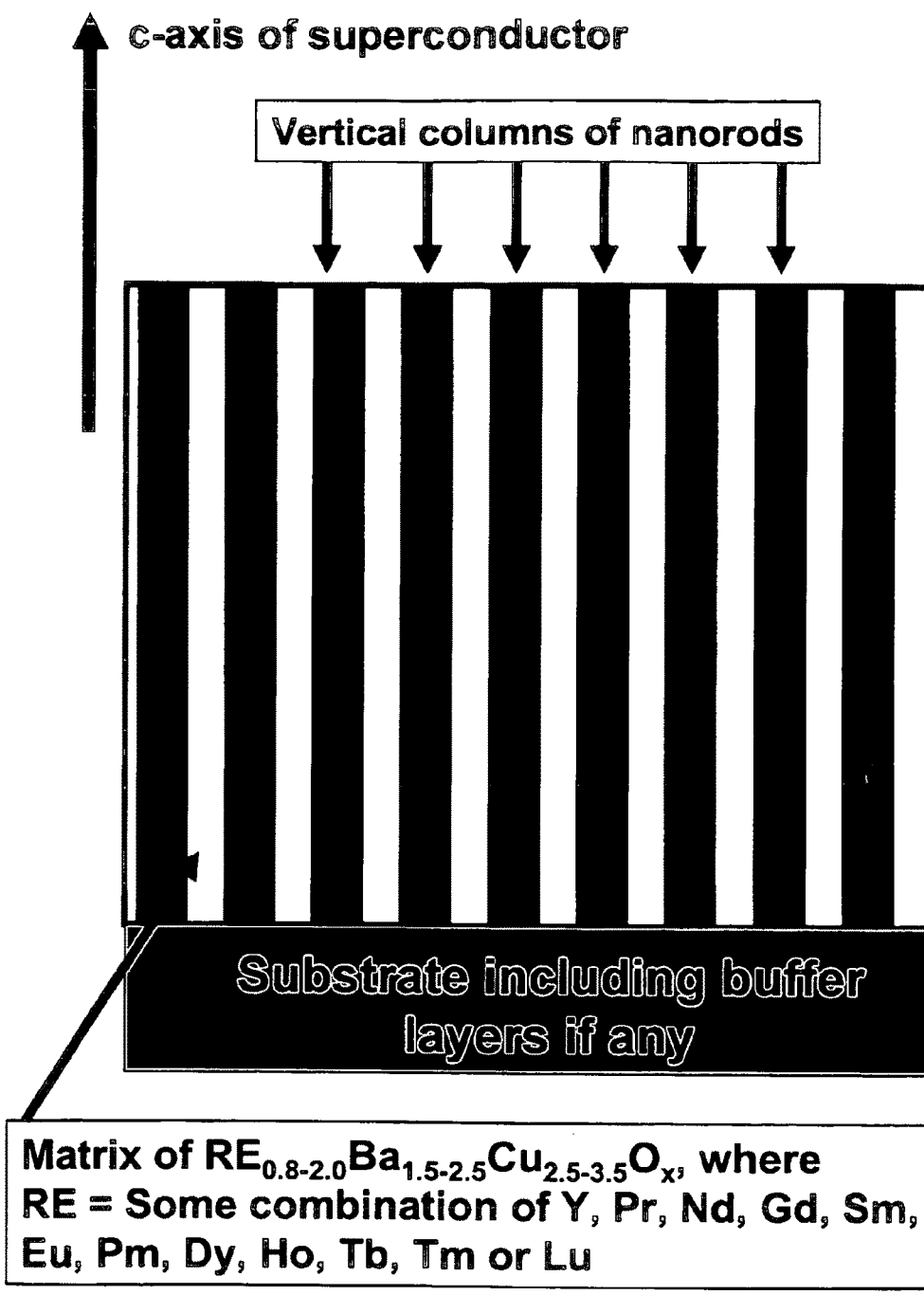
FIG. 3 shows an idealized schematic representation in cross-section of self-assembled or ordered nanorods within a superconducting device layer grown epitaxially on a substrate. In this case the ordering of nanorods occurs such that the nanorods are aligned parallel to the film normal.
Figure 4:
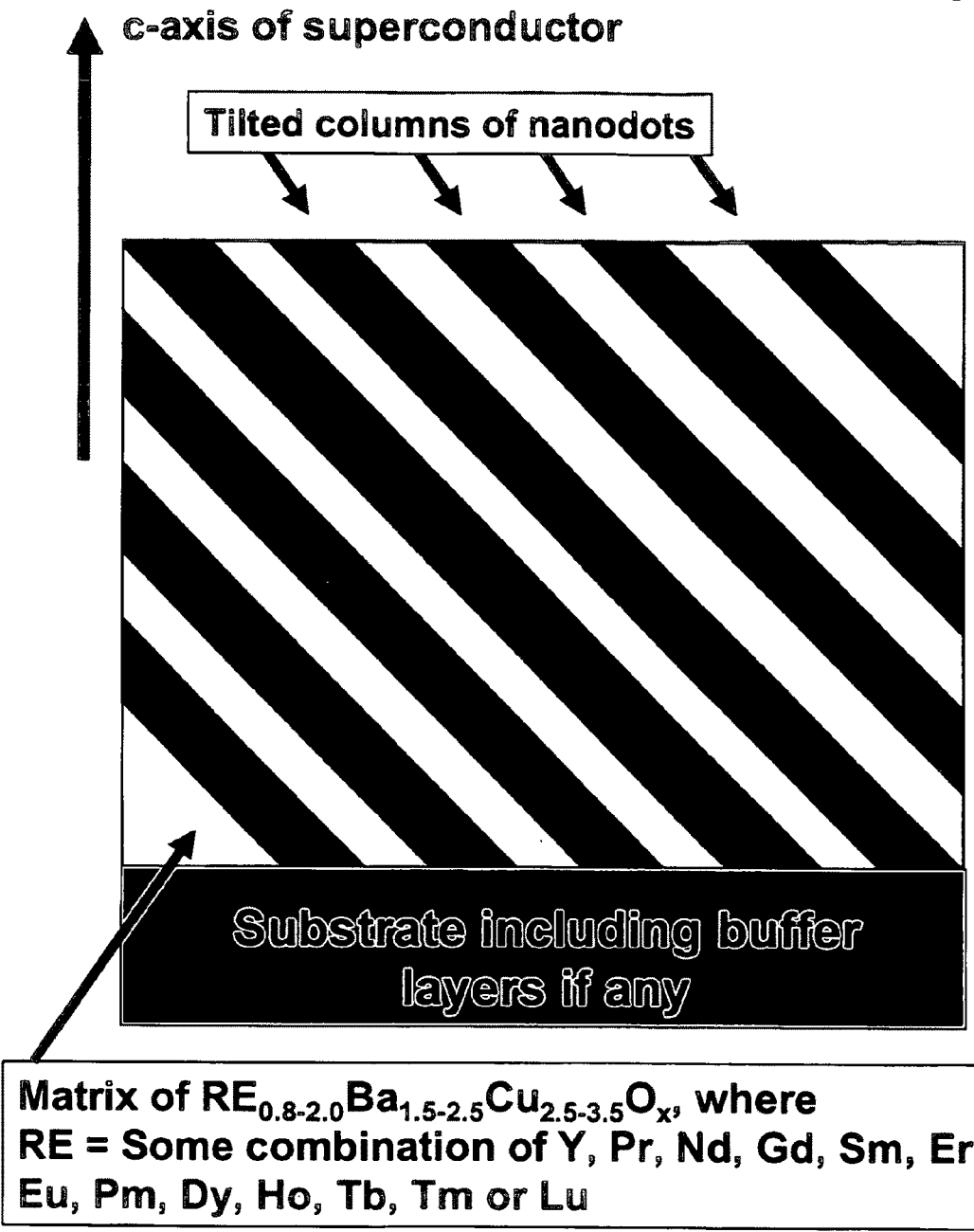
FIG. 4 shows an idealized schematic representation in cross-section of self-assembled or ordered nanorods within a superconducting device layer grown epitaxially on a substrate. In this case the ordering of nanorods is at an angle to the film normal.
Figure 5:
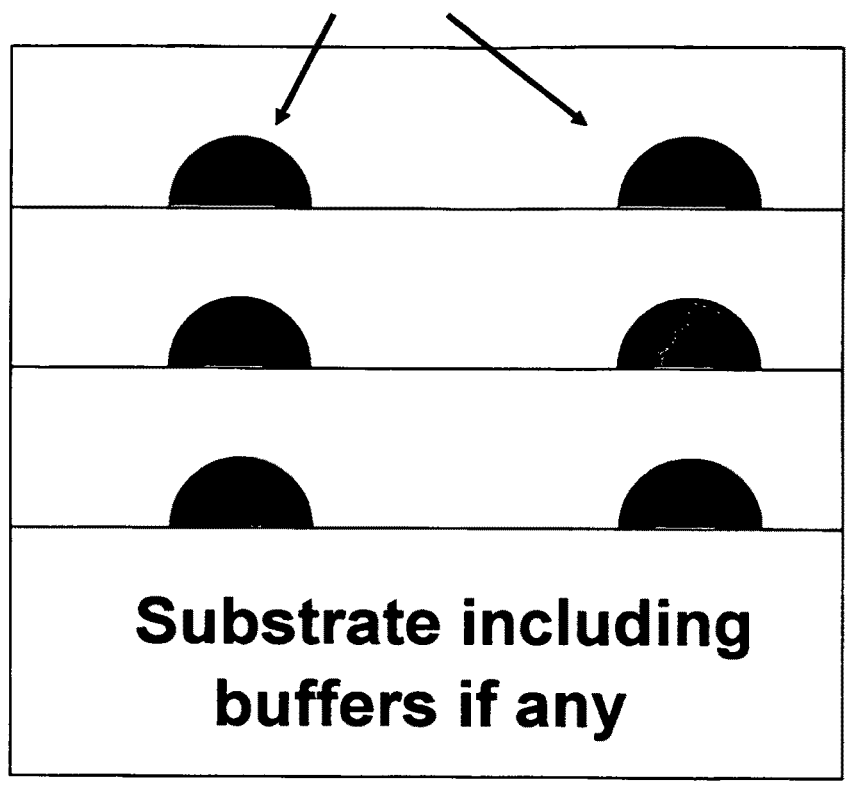
FIG. 5 shows an idealized schematic representation of self-assembled or ordered nanodots within a device layer grown epitaxially on a substrate. In this case the ordering of nanodots is vertical, however the nanodots have a curvature to them as shown.

FIG. 1 shows schematic of a cross-section of desired structure. Shown in the figure is an epitaxial device film on a biaxially textured substrate containing self-assembled nanodots of a second phase material. In this case, all the columns of self assembled nanodots are well aligned in a direction perpendicular to the substrate. FIG. 2 shows schematic of an epitaxial device film on a biaxially textured substrate containing self-assembled nanodots of a second phase material wherein the columns of self assembled nanodots are well tilted with respect to the direction perpendicular to the substrate. FIG. 3 shows an idealized schematic representation in cross-section of self-assembled or ordered nanorods within a superconducting device layer grown epitaxially on a substrate. In this case the ordering of nanorods occurs such that the nanorods are aligned parallel to the film normal. FIG. 4 shows an idealized schematic representation in cross-section of self-assembled or ordered nanorods within a superconducting device layer grown epitaxially on a substrate. In this case the ordering of nanorods is at an angle to the film normal. FIG. 5 shows schematic of an epitaxial device film on a biaxially textured substrate containing self-assembled nanodots of a second phase material wherein the self assembled nanodots are not flat but curved. In all of these figures shown, the device is a superconducting device, with the superconducting layer having a composition of RE 0.8-2.0 Ba 1.5-2.5 Cu 2.5-3.5 O x. In this formula, RE refers to some combination of Y, Pr, Nd, Gd, Sm, Er, Eu, Pm, Dy, Ho, Tb, Tm or Lu. In this application, RE 0.8-2.0 Ba 1.5-2.5 Cu 2.5-3.5 O x-type superconductors are referred to by the acronym REBCO. YBa 2 Cu 3 O x which is the most researched ~90K high temperature superconductor is a line compound with respect to non-oxygen atoms. Of special significance are the light rare-earth elements (LRE) including La, Pr, Nd, Sm, Eu and Gd for which an extensive solid solution corresponding to LRE 1+x Ba 2−x Cu 2.5-3.5 O x is formed by the partial substitution of RE for Ba. This has been attributed in the literature to the large ionic radii of these ions which approaches that of Ba. When such a site substitution occurs, local modulations in strain can result in enhanced flux-pinning and improvement of superconducting properties, especially in the presence of applied magnetic fields. Another possible mechanism by which RE substitutions in the YBa 2 Cu 3 O x structure can result in enhanced flux-pinning is the formation of finely distributed lower-T c regions in the nanoscale from nanoscale or local incorporation RE substitutions in the YBa 2 Cu 3 O x lattice. Also, nanoscale fluctuations in RE 0.8-2.0 Ba 1.5-2.5 Cu 2.5-3.5 O x can result in locally oxygen deficient zones which will also result in enhanced flux-pinning. Lastly in some cases, nanoscale precipitates of RE 2 O 3 form because of precipitation of insolubility in growth or processing regimes employed. To maximize the impact of the columnar defects shown in FIGS. 1-17, it is important to have a matrix around these defects optimized with respect to its superconducting properties. This can be achieved by using a superconductor of the composition RE 0.8-2.0 Ba 1.5-2.5 Cu 2.5-3.5 O x where RE refers to some combination of Y, Pr, Nd, Gd, Sm, Er, Eu, Pm, Dy, Ho, Tb, Tm or Lu. Prior work in the area studying the effects of rare-earth substitutions includes—V. Selvamanikcam, Y. Xie, J. Reeves, and Y. Chen, "MOCVD-based YBCO coated conductors," MRS Bulletin, August 2004, 579-582; M. R. Koblischka, M. Muralidhar and M. Murakami, Flux-pinning sites in melt-processed (Nd 0.33 Eu 0.33 Gd 0.33)Ba 2 Cu 3 O x superconductors," Physica C, 337, 31-38 (2000); H. Wu, K. W. Dennis, M. J. Kramer, and R. W. McCallum, "Solubility limits of LRE 1+x Ba 2−x Cu 2.5-3.5 O x," Applied Superconductivity, 6, 87-107 (1998); J. L. MacManus-Driscoll, S. R. Foltyn, Q. X. Jia, H. Wang, A. Serquis, B. Maiorov, L. Civale, Y. Lin, M. E. Hawley, M. P. Maley and D. E. Peterson, "Systematic enhancement of in-field critical current density with rare-earth ion size variance in superconducting rare-earth barium cuprate films," Appl. Phys. Lett., 84, 5329-5331 (2004); J. L. MacManus-Driscoll, S. R. Foltyn, B. Maiorov, Q. X. Jia, H. Wang, A. Serquis, L. Civale, Y. Lin, M. E. Hawley, M. P. Maley and D. E. Peterson, "Rare-earth ion size effects and enhanced critical current densities in Y½Sm⅓Ba2Cu3O x," Appl. Phys. Lett., 86, 32505-32507 (2005). Combination of the effects shown schematically in FIGS. 1, 2 and 3 occur during film growth and these will be mentioned in this example and the next. The selection of the composition RE 0.8-2.0 Ba 1.5-2.5 Cu 2.5-3.5 O x is based on prior work which suggests that outside this compositional region, too much of non-superconducting phase results and this can be detrimental to superconducting properties.

Figure 6:
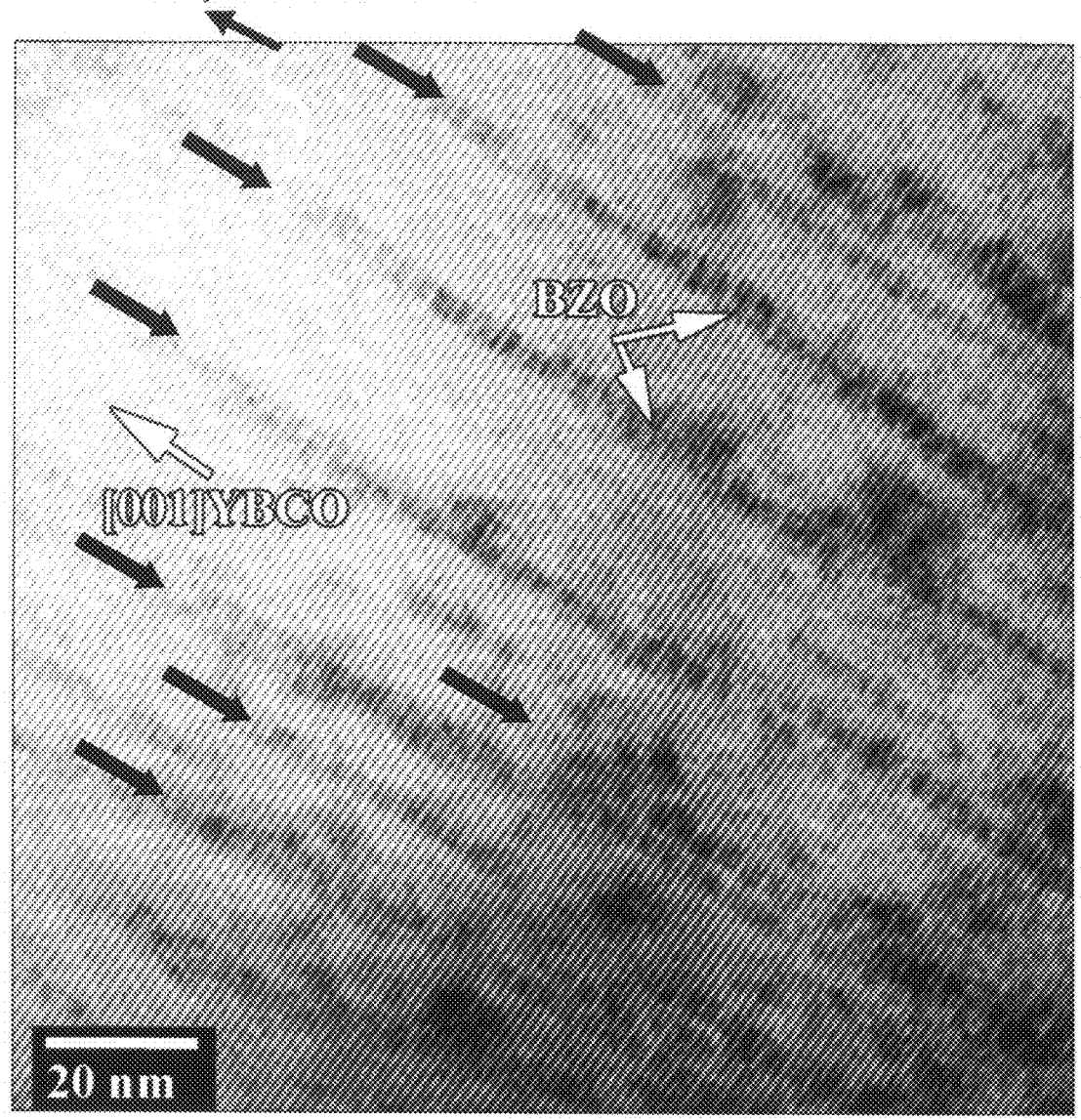
FIG. 6 shows a cross-section, transmission electron microscopy (TEM) image of a 0.2 μm thick, $YBa_2Cu_3O$ (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the taxis of YBCO. Black arrows in the figure show the location of some of the columns of self-assembled nanodots of BZO.
Figure 7:
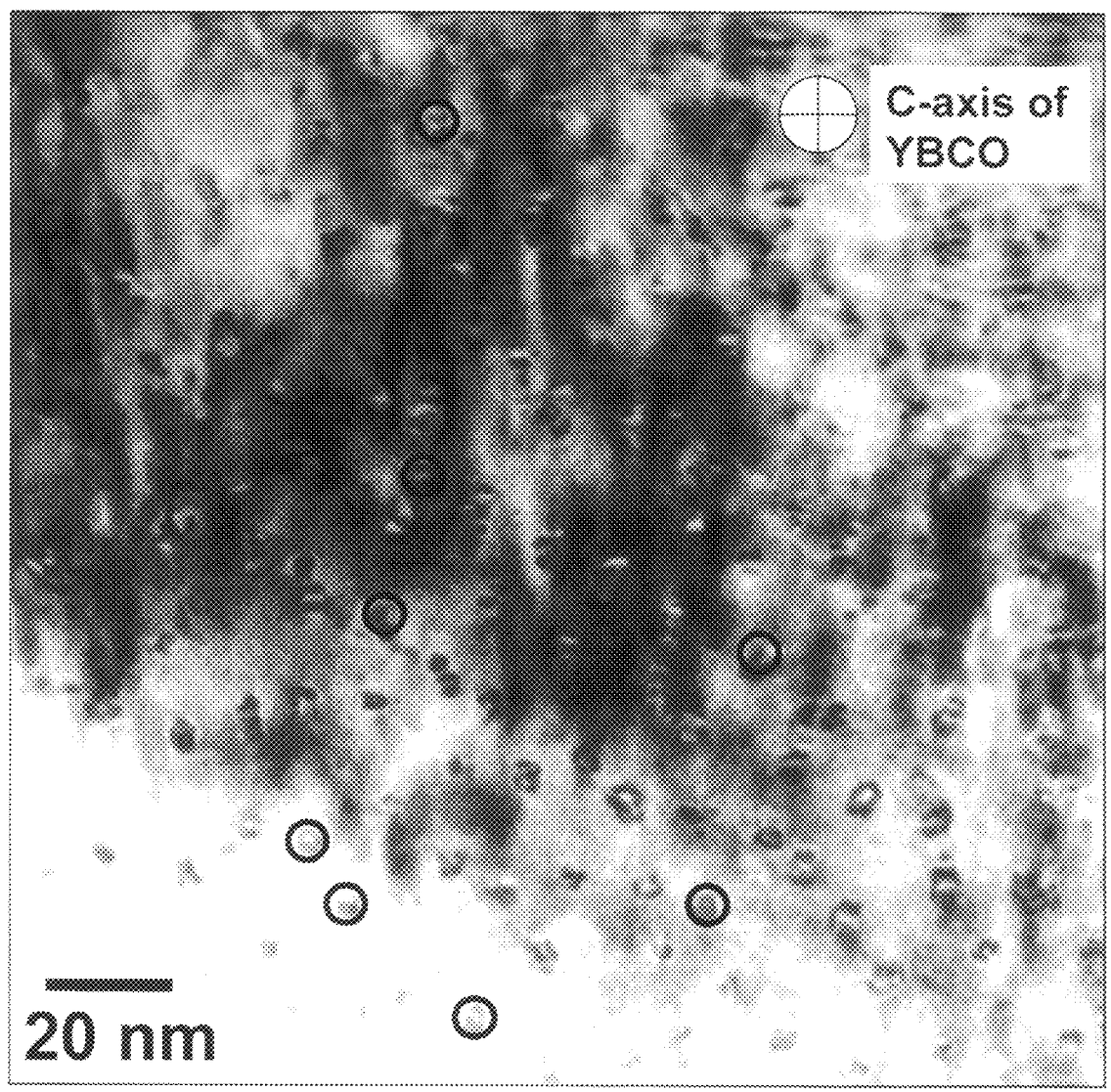
FIG. 7 shows a plan view TEM image of the YBCO film shown in FIG. 6. This image is taken when looking down the c-axis of YBCO. Circular defects seen are the self-assembled nanodots of YBCO. Several of these marked with circles to highlight them.
Figure 8:
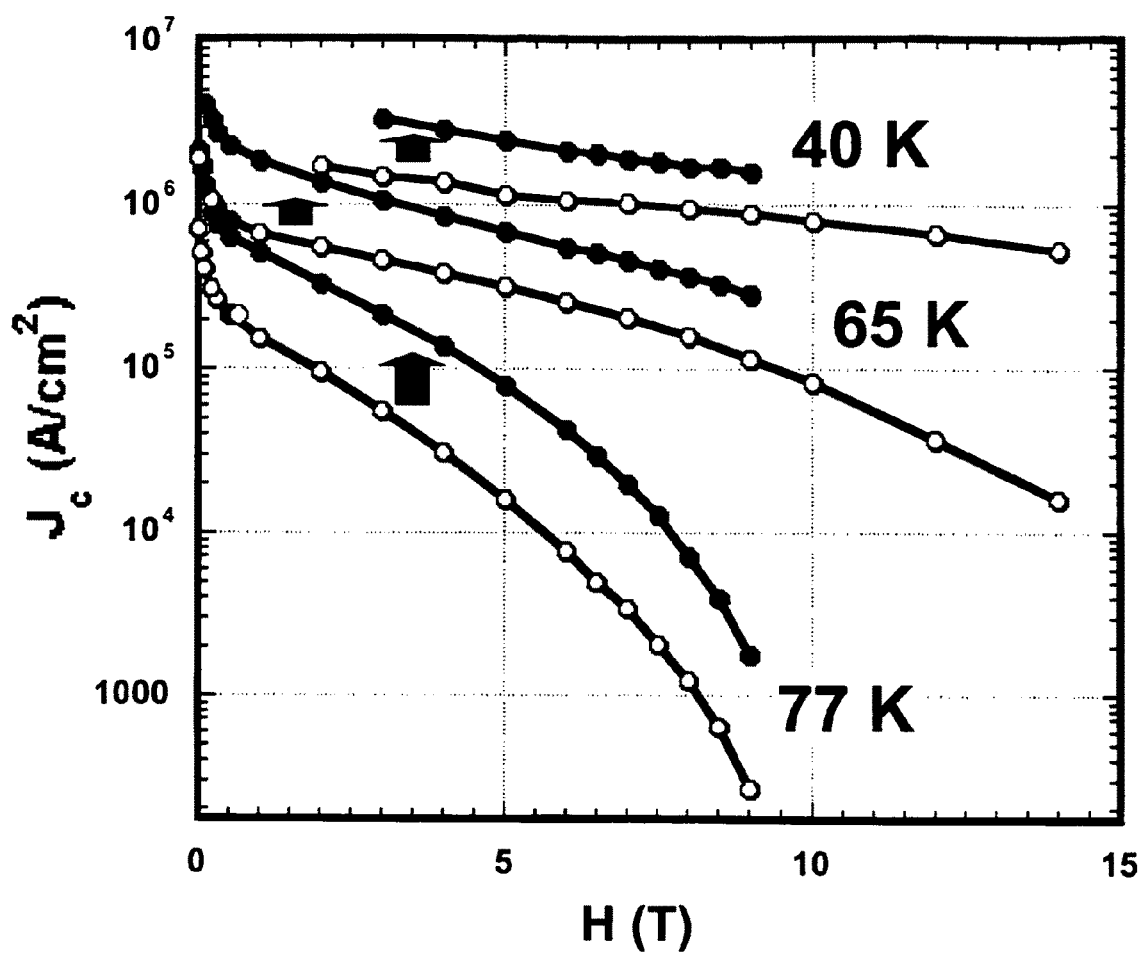
FIG. 8 shows the critical current density ($J_c$) as a function of applied magnetic field at measurement temperatures of 77K, 65K and 40K. The open circles show the data for an epitaxial 0.2 μm thick, YBCO film in which no nanodots or nanorods have been incorporated. The closed circles represent data for a 0.2 μm thick, YBCO film with self-assembled nanodots as shown in FIG. 6 and FIG. 7. As is clear from the figure, the critical current density for the YBCO film with self-assembled nanodots of BZO is significantly higher than that of the YBCO film with no self-assembled nanodots incorporated at all values of applied field and at all the measurement temperatures. The arrows show the improvement in $J_c$ at each measurement temperature. Both films were grown epitaxially on a biaxially textured substrate comprised of Ni-3 at % W with epitaxial buffer layers of $Y_2O_3$/Yttria stabilized zirconia/$CeO_2$.

FIG. 6 shows a cross-section, transmission electron microscopy (TEM) image of the composite, 0.2 μm thick, YBCO+BZO film, grown epitaxially on RABiTS of configuration Ni-5 at % W (50 μm)/Y 2 O 3 (75 nm)/YSZ (75 nm)/CeO 2 (75 nm) via PLD deposition. PLD deposition was performed using a XeCl (308 nm) excimer laser, LPX 305 at a repetition rate of 10 Hz. The substrate deposition temperature was 790° C. and a background oxygen partial pressure of 120 mTorr was used. The target used for the deposition contained 2 volume percent of BZO nanopowder. Columns of BZO nanodots aligned along the [001] or the crystallographic c-axis of YBCO can be seen in the image. The black arrows on the image point to the various columns of BZO. The white arrow shows the direction of the c-axis of the YBCO film. Parallel lattice fringes of the ab-planes in YBCO are also shown in the figure. The image was taken with the sample tilted along the g=001 vector of the YBCO film in order to better visualize the columnar properties of the nanoparticles due to their relatively small size compared to the local thickness of the TEM sample. FIG. 7 shows a plan view TEM image in low magnification, directed down the crystallographic c-axis of YBCO. The image shows the areal distribution of nanodots within the thin section of a TEM foil. The intersecting lines within the particles are extinction bands, with the left side of the image being a thicker region of the TEM foil than that of the right. From the areal density of BZO nanoparticles in FIG. 5, one finds a matching field, a magnetic field with equivalent vortex density B φ=φo/a 2, of ~8-10 T, where φo=2.07·10-11 T-cm 2 is the flux quantum and a is the average in-plane separation of vortices. Higher magnification TEM images show that around each BZO nanodot, four misfit dislocations are observed. Since the nanodots and nanorods are aligned along the c-direction of YBCO, the strain from the misfit dislocations is also aligned and extended. For this unique configuration, these BZO nanodots and nanorods and the correlated misfit dislocations around them may be expected to form ideal flux-pinning sites. The lattice mismatch between YBCO and BZO is ~8% and the self-assembled structure of BZO within YBCO occurs due to strain minimization.

The superconducting transport properties of the epitaxial, YBCO films, 0.2 μm thick, fabricated both with and without incorporation of self-assembled nanodots and nanorods grown on RABiTS of configuration Ni-5 at % W (50 μm)/Y 2 O 3 (75 nm)/YSZ (75 nm)/CeO 2 (75 nm) are shown in FIG. 6. In this plot of transport critical current density (J c) versus applied field, H, for YBCO and YBCO+2 vol % BZO sample with H c at 77 K, shows that the dopants reduce the sensitivity to magnetic field. The transport critical current density (J c) is the maximum amount of supercurrent per unit area of the film which can be carried before the film becomes non-superconducting. The enhancement in J c can be seen for all fields despite a decrease in the transition temperature of the doped film (~87 K as determined magnetically via a SQUID magnetometer) compared to the undoped film (T c ~90 K). In a log-log plot of J c normalized to self-field J c versus applied field, it can be determined that the exponent in the power-law relationship J c ~H–α, is 0.31 for the film containing the BZO nanodots and nanorods, compared to 0.5 for the undoped YBCO film. This reduced fall-off in J c as a function of applied field shows the strong pinning for H∥c for the doped samples. The data shown in FIG. 8 of transport J c versus H at various applied fields applied parallel to the c-axis at 77, 65, and 40 K, adequately shows the trends and improvement in J c obtained. The data show that the enhancement of J c at higher fields (over 7 T) with self-assembled BZO nanodots and nanorods is even more significant, a factor of 6 or more; this improvement in J c also extends to lower temperatures, as is evident in the figure.

Figure 9:
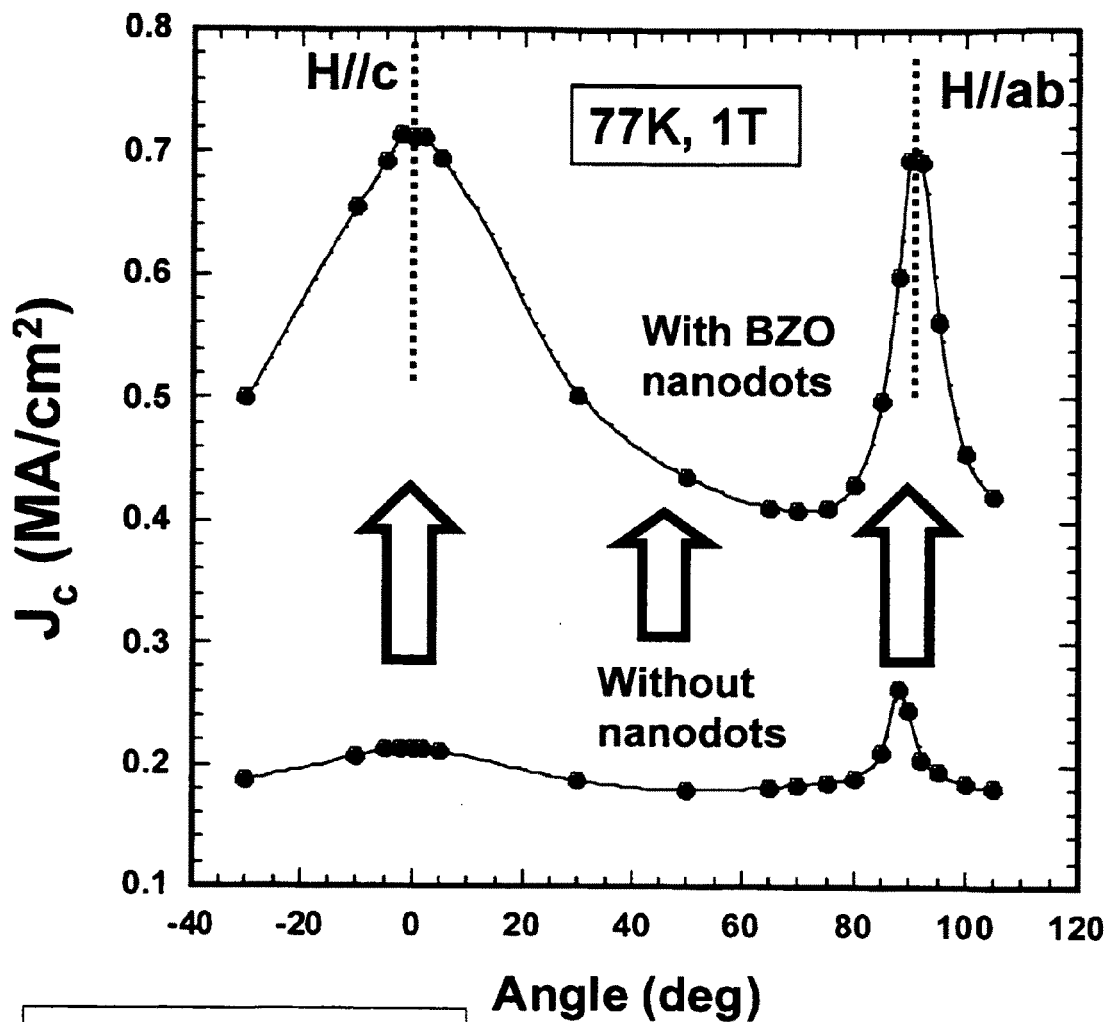
FIG. 9 shows the critical current density ($J_c$) as a function of angle of applied magnetic field to the c-axis of YBCO at 77K and an applied magnetic field of 1 Tesla. Data for an epitaxial 0.2 μm thick, YBCO film in which no nanodots or nanorods have been incorporated, as well as, for a 0.2 μm thick, YBCO film with self-assembled nanodots incorporated within it, is shown. As is clear from the figure, the critical current density for the YBCO film with self-assembled nanodots of BZO is significantly higher at all angles of the applied magnetic field than that of the YBCO film with no self-assembled nanodots incorporated. Both films were grown epitaxially on a biaxially textured substrate comprised of Ni-3 at % W with epitaxial buffer layers of $Y_2O_3$/Yttria stabilized zirconia/$CeO_2$. The bottom of FIG. 7 shows that the applied field is always parallel to the current at all angles so that the Lorentz force is always maximum.
Figure 9:
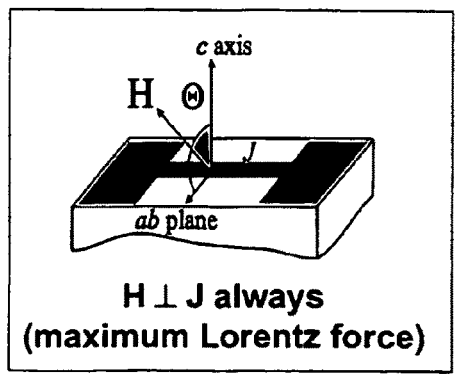

FIG. 9 shows the angular dependence of J c, taken at 77K and 1 Tesla applied magnetic field with the magnetic field always being perpendicular to the current to have the maximum Lorentz force. The bottom of FIG. 9 shows schematically that in this measurement, the applied magnetic field is always perpendicular to the current at all angles in order to have the maximum Lorentz force. The angular dependence curve for the film with self-assembled nanodots is shifted to higher J c at all angles. In particular, a very pronounced peak for H∥c (angle=0°) can be observed, indicative of strong pinning defects along the c-axis for the film containing BZO nanodots and nanorods. In certain locations in the films the self-assembled nanodots combine to form nanorods aligned along the c-axis of YBCO. Clearly a very dramatic improvement in the superconducting properties is obtained by incorporation of BZO nanodots and nanorods.

Example 2

A 3 μm thick YBCO composite film containing self-assembled nanodots of BZO was prepared by pulsed laser deposition (PLD) using a XeCl (λ=308 nm) excimer laser at a repetition rate of 10 Hz. The 2-vol % BaZrO 3-YBCO PLD target (1 inch diameter, 0.25 inch thick) was made by mixing YBCO powder and commercially available BaZrO 3 nanopowder. The growth temperature was 790° C. and the base chamber pressure was 2×10-6 Torr with an oxygen partial pressure of 230 mTorr. All depositions were performed in a stationery configuration on the technically important RABiTS substrates with the configuration Ni-3 at % W (50 μm)/Y 2 O 3 (65 nm)/YSZ (185 nm)/CeO 2 (30 nm). The Y 2 O 3 layer was deposited using e-beam evaporation and YSZ and CeO 2 layers were deposited using rf-sputtering. The standard four-point probe method with a voltage criterion of 1 μV/cm was used for the transport measurements. Cross-section transmission electron microscopy (TEM) was used for microstructural analysis using a Hitachi HF-2000 Microscope with field emission gun (FEG) operated at 200 kV and a Philips CM200 Microscope with field emission gun (FEG) operated at 200 kV.

Figure 10:
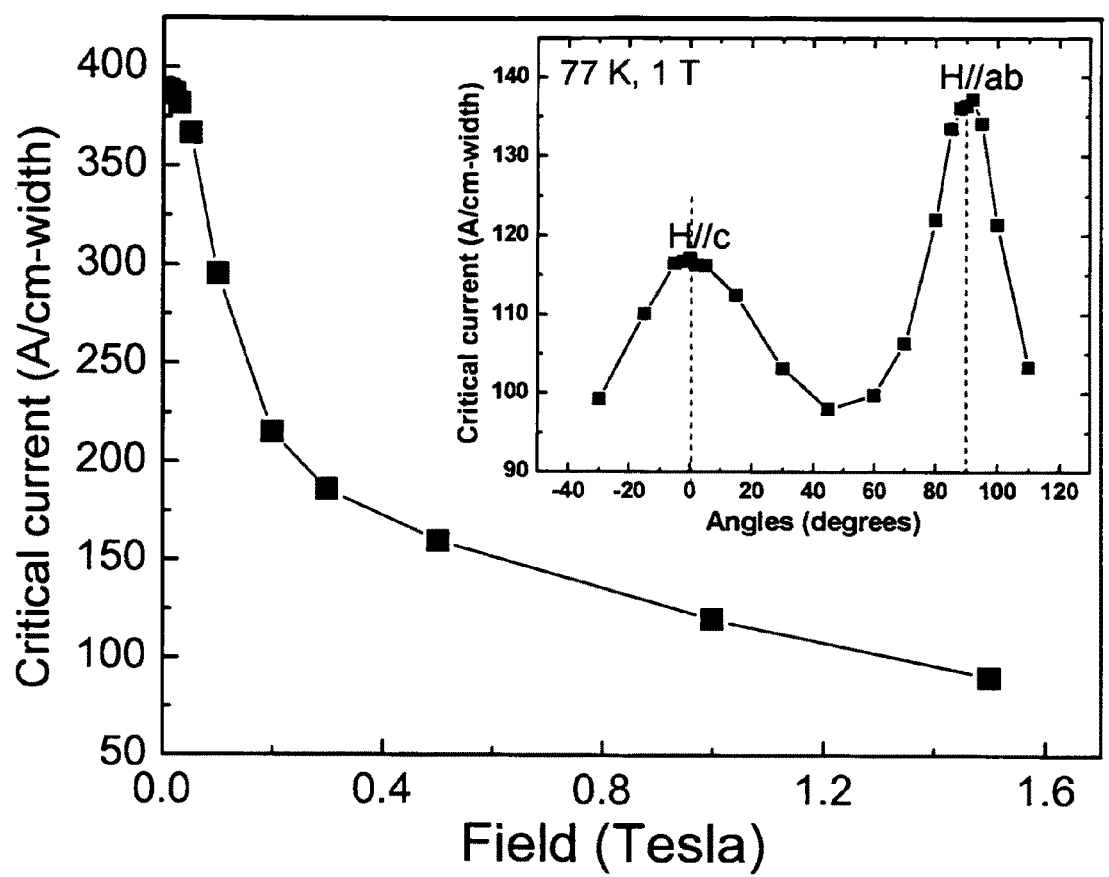
FIG. 10 shows the critical current versus applied magnetic field at 77K with the magnetic field parallel to the c-axis of YBCO for a 3 μm film of YBCO with self-assembled nanodots of BZO. Very high supercurrents are obtained at all fields. The inset shows the angular dependence of the critical current at 77K in an applied magnetic field of 1 T. The YBCO film was grown epitaxially on a biaxially textured substrate comprised of Ni-3 at % W with epitaxial buffer layers of $Y_2O_3$/Yttria stabilized zirconia/$CeO_2$.

FIG. 10 shows the critical current (I c) versus applied magnetic field at 77 K with the magnetic field parallel to YBCO c-axis (H∥c) for the 3.0 μm thick YBCO+2 vol % BZO film on RABiTS. The I c decrease is only a factor of 4.3 at 1.5 Tesla. The self-field I c of this film was 389 A and the corresponding self-field J c was 1.3 MA/cm 2. The exponent α, in the relation J c ~H–α was determined to be 0.34 for this sample compared to the typical value of 0.5 for pure YBCO films, indicating strong pinning for H∥c for the BZO doped film. The inset shows the angular dependence of I c at 77 K and 1 Tesla, with the field always in the maximum Lorentz force configuration. Part of the variation of I c with field orientation or angle is expected due to the electronic mass anisotropy of YBCO. However, the dominant peak for H∥c indicates that there is strong vortex pinning by c-axis correlated defects in this film.

Figure 11:
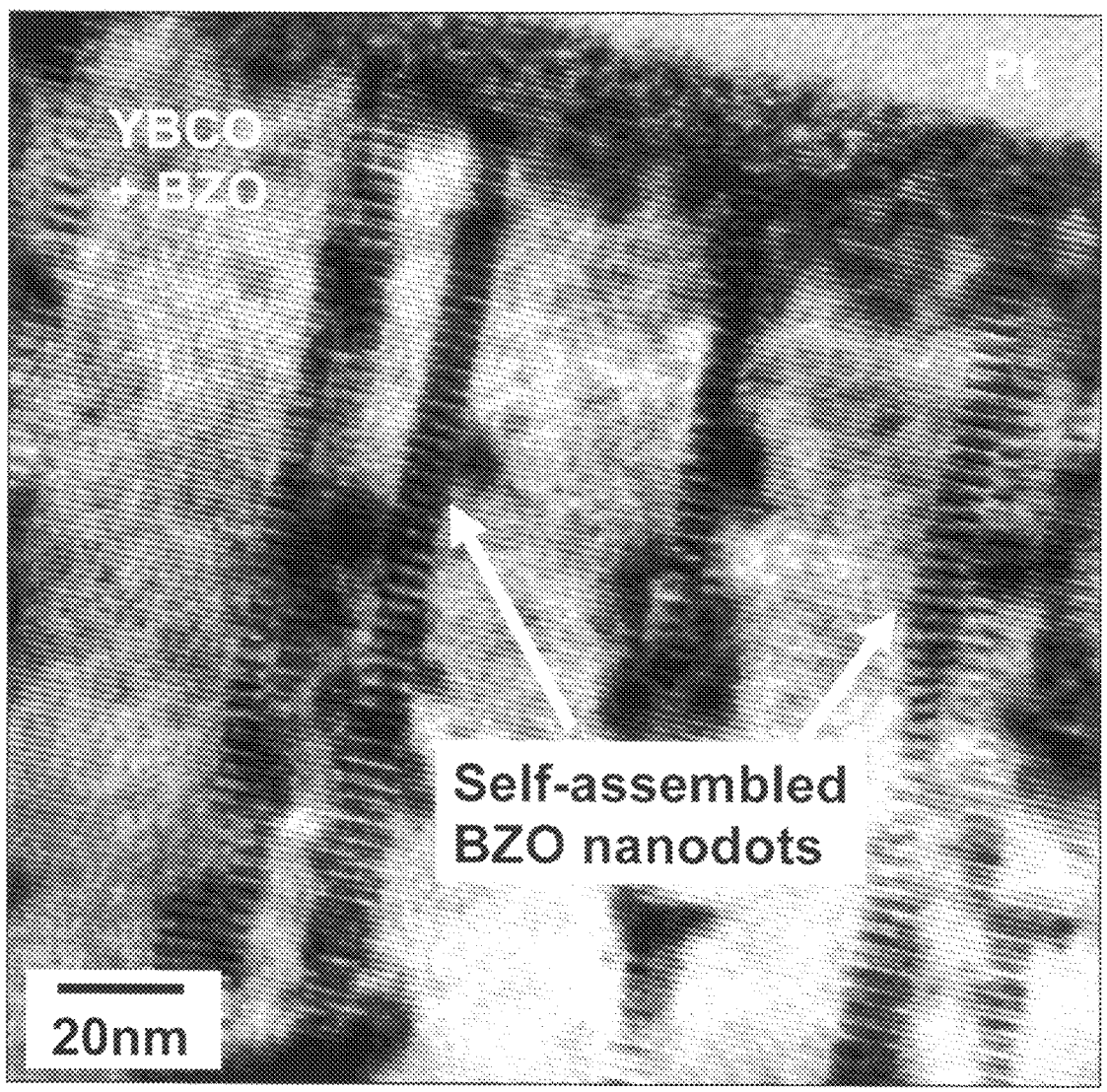
FIG. 11 shows a cross-section, transmission electron microscopy (TEM) image of a 3 μm thick, $YBa_2Cu_3O$ (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the c-axis of YBCO. Columns of self-assembled nanodots of BZO are marked in the figure.

FIG. 11 shows a cross-section TEM image of the 3 μm thick, composite YBCO film grown epitaxially on RABiTS with the configuration Ni-3 at % W (50 μm)/Y 2 O 3 (65 nm)/YSZ (185 nm)/CeO 2 (30 nm), Extended columns of BZO nanodots aligned along the crystallographic c-axis of YBCO, the growth direction of the film, can be seen. Similar to the 0.2 μm thick YBCO films reported in Example 1, self-aligned BZO nanodots were observed through the entire cross section of the 3 μm thick YBCO film. Extended BZO nanodots were formed from the bottom of YBCO layer to the top of the YBCO layer. The platinum layer shown in the figure was deposited on top of the YBCO layer in order to prepare the TEM sample. These self-aligned columns of BZO nanodots form to minimize energy or strain in the growing film stemming from the large lattice mismatch between YBCO and BZO of ~9%. Since the ordering of nanodots and/or nanorods is driven by strain minimization, it is expected that a certain minimum lattice mismatch is required to provide a driving force for ordering via strain minimization. A minimum of 3% lattice mismatch is estimated to be required between the nanodots and/or nanorods and the film matrix phase. As mentioned previously in the discussion of Example 1, using high resolution electron microscopy in plan-view, for 0.2 μm the thick films on RABiTS, four misfit edge dislocations exist around each BZO nanodot were observed. Nanodots align vertically, so that these misfit dislocations are also aligned, thereby minimizing the misfit strain in the film. These aligned misfit dislocations form ideal, extended flux-pinning centers. The width of an individual nanodot is wider in the 3 μm film than the 0.2 μm film shown in Example 1. This is due to different growth conditions and strains produced in a thicker film.

Figure 12:
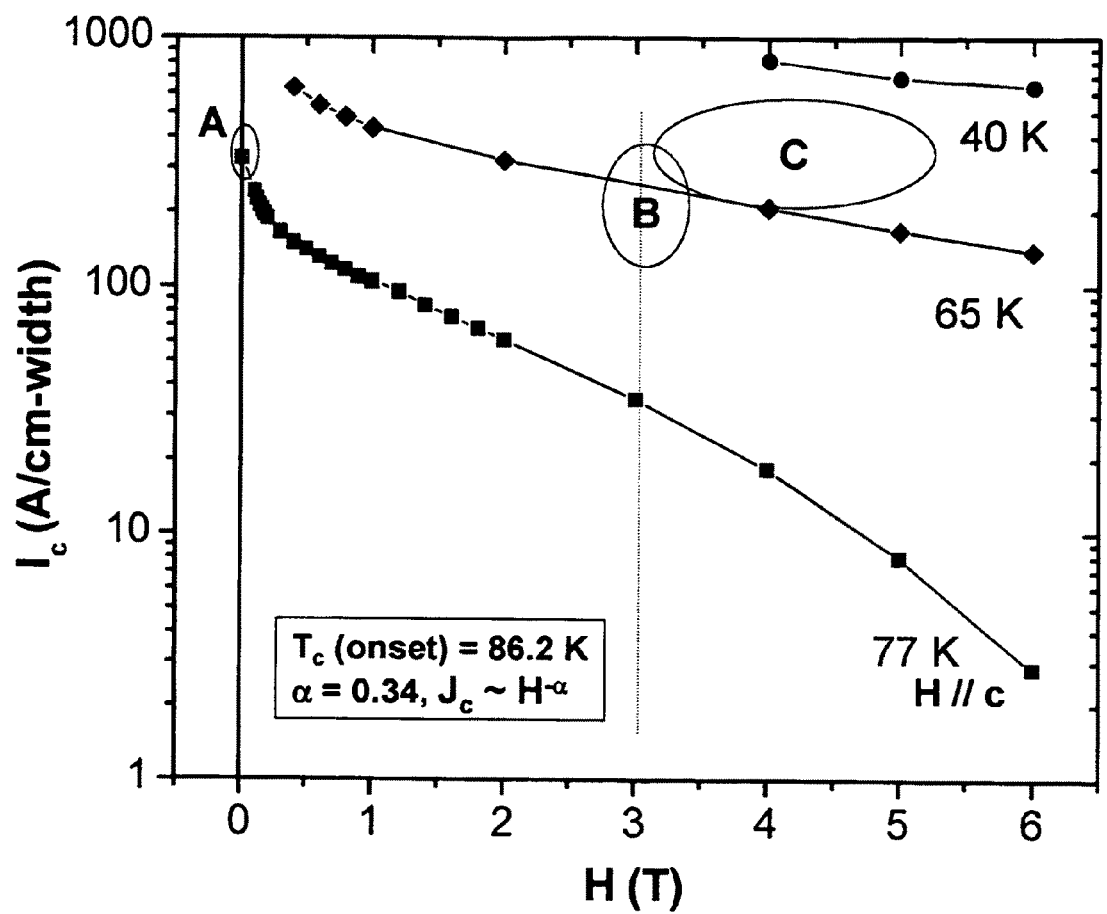
FIG. 12 shows critical currents as a function of applied magnetic field at higher applied magnetic fields and at 3 different measurement temperatures, 77, 65 and 40 K. Industry's wire performance requirements for some key applications are shown by the marked elliptical regions: [A] Underground transmission power cable applications require $I_c$ 300 A/cm in self-field at 70-77 K; [B] Military applications require an Ic 100 A/cm and a $J_E$ 15 kA/$cm^2$ at 3 T, 65 K; [C] For large-scale rotating machinery such as commercial motors and generators, an engineering critical density ($J_E$) of 20-30 kA/$cm^2$ in applied magnetic fields in the range of 3-5 T at operating temperatures of 55-65 K is required. As can be seen, the superconducting transport properties of the single layer, 3 μm thick, YBCO with self-assembled nanodots of BZO, meets the performance requirements for these applications. The YBCO film was grown epitaxially on a biaxially textured substrate comprised of Ni-3 at % W with epitaxial buffer layers of $Y_2O_3$ Yttria stabilized zirconia/$CeO_2$.
Figure 13:
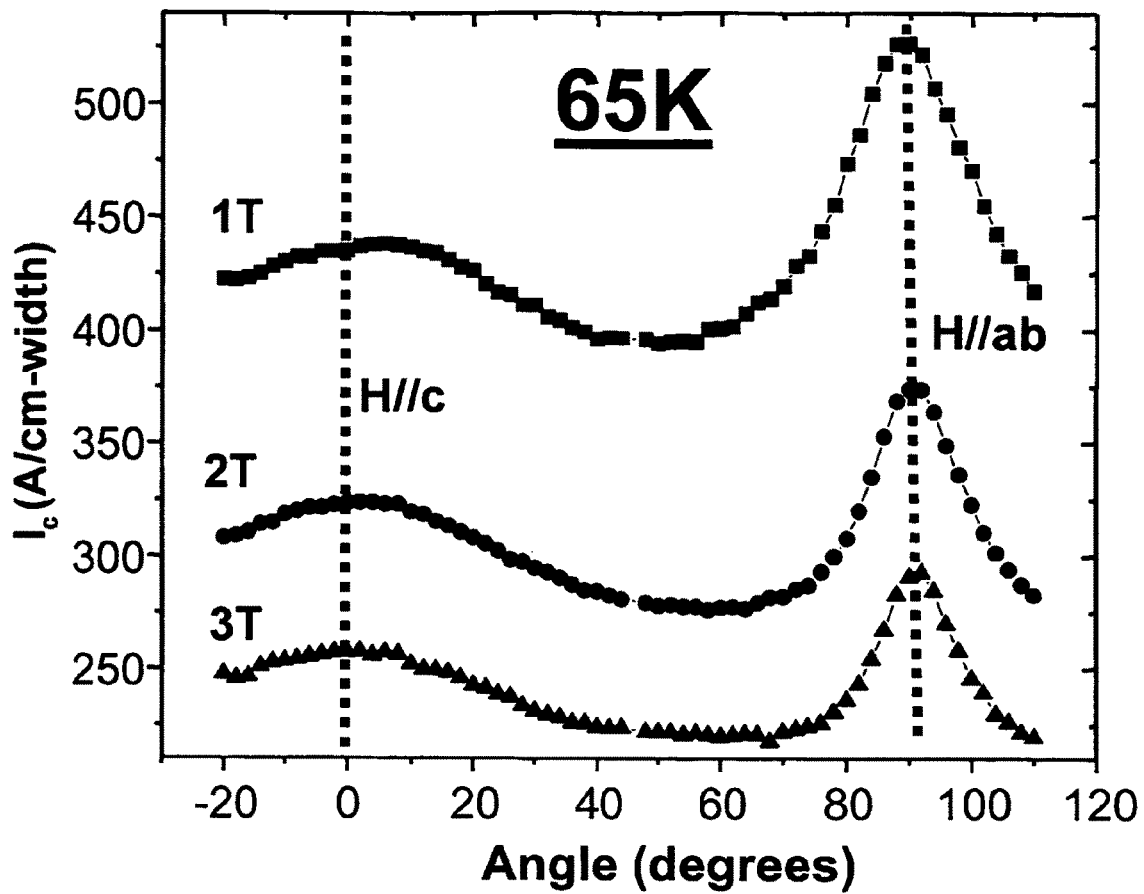
FIG. 13 shows critical current per unit width ($I_c$) versus angle of applied magnetic field at 65 K and with applied magnetic fields of 1, 2, and 3 Tesla for the film referred to in FIGS. 8, 9 and 10. The applied magnetic field was always in the maximum Lorentz force configuration. At 65 K, 1 Tesla, the current per unit width is ~400 A/cm for all angles or applied field orientation. At 65 K, 1 Tesla, the calculated engineering critical density, ($J_E$) is ~80,000 A/$cm^2$ without considering a stabilizer and ~40,000 A/$cm^2$ assuming a 50 μm thick stabilizer at the angle corresponding to the lowest $I_c$. At 65 K, 3 Tesla, the current per unit width is greater than 200 A/cm for all angles or applied field orientation. At 65 K, 3 Tesla, the calculated engineering critical density, ($J_E$) is 40,740 A/$cm^2$ without considering a stabilizer and 21,154 A/$cm^2$ assuming a 50 μm thick stabilizer at the angle corresponding to the lowest $I_c$.

This periodic array of columnar defects is highly effective in pinning superconducting vortices or flux-lines, thereby resulting in the significantly enhanced performance of the 2G wire in high, applied magnetic fields, as shown in FIGS. 12 and 13. FIG. 12 shows the critical current (I c) versus applied magnetic field (H) for H∥c, at higher fields and different temperatures of 77, 65 and 40 K, respectively. The sample used for these measurements is the same BZO-doped sample for which data are shown in FIG. 10. Due to the limitations on the maximum measuring current, the original 5 mm wide sample was patterned into a 0.2 mm wide bridge. The self-field I c is somewhat reduced from that shown in FIG. 10 due to sample handling (mounting and unmounting from one measurement system and re-mounting in another system) as well as possible damage by laser-scribing used to pattern the bridge on the sample. Nevertheless, at 77 K and low field, I c is still over 300 A/cm-width which is suitable for power cable applications. As shown in FIG. 12, at 65 K and 3 T, I c is over ~250 A/cm-width which is well above the threshold values of ~100 A/cm-width for military applications such as supermagnets for electric ship propulsion systems and magnetic energy storage. At 65 K and 3 T, the engineering critical density (J E) for H||c is 46 kA/cm 2 without consideration of a thermal and adiabatic stabilization layer. For practical applications, a stabilizer layer comprising a high electrical conductivity material such as Cu of about 50 μm thickness will be required to protect the superconductor in case of local loss of superconductivity. If one were to assume that a 50 μm thick stabilizer layer will be deposited on top of the YBCO layer, the J E for H||c is calculated to be over 21 kA/cm 2, still well over the required 15 kA/cm 2. For large-scale rotating machinery such as motors and generators, a J E of 20-30 kA/cm 2 in the operating temperature range of 55-65K in applied fields of 3-5 T is required. The operating temperature range of 55-65K is needed for widespread application as this is a temperature regime accessible by present cryocooler technology. FIG. 12 shows that at 65 K, the J E corresponds to 46, 37 and 33 kA/cm 2 without the stabilizer in applied fields of 3, 4 and 5 T, clearly above the range needed for application at 65 K. At lower temperatures, for example at 55 K, the J E is expected to much higher than the values at 65 K. At 40 K, extrapolated I c is over 1000 A/cm-width in applied fields of 3.5 T.

FIG. 13 shows the angular dependence of I c at 65 K at applied magnetic fields of 1, 2 and 3 T, with the magnetic field always being perpendicular to the current to have the maximum Lorentz force. All the three angular dependent I c curves show similar features indicating that similar pinning mechanisms are operational at these temperatures. At 65 K, 1 T, an I c of ~400 A/cm-width for all field orientations was obtained. At 3 T, an I c of ~200 A/cm-width for all magnetic field orientations was obtained. The engineering current density, J E, at 65 K, 3 T is calculated to be over ~40 kA/cm 2 at all applied field orientations without consideration of a stabilizer and 21 kA/cm 2 assuming a 50 μm thick stabilizer, still well over the required 15 kA/cm 2 value. At 65 K, 1 Tesla, the calculated engineering critical density, (J E) is ~80,000 A/cm 2 without considering a stabilizer and ~40,000 A/cm 2 assuming a 50 μm thick stabilizer at the angle corresponding to the lowest I c. The phrase "total engineering critical density" is implied to include the thickness of the stabilizer layer as well. Such high performance superconducting films have been demonstrated for the first time.

Figure 14:
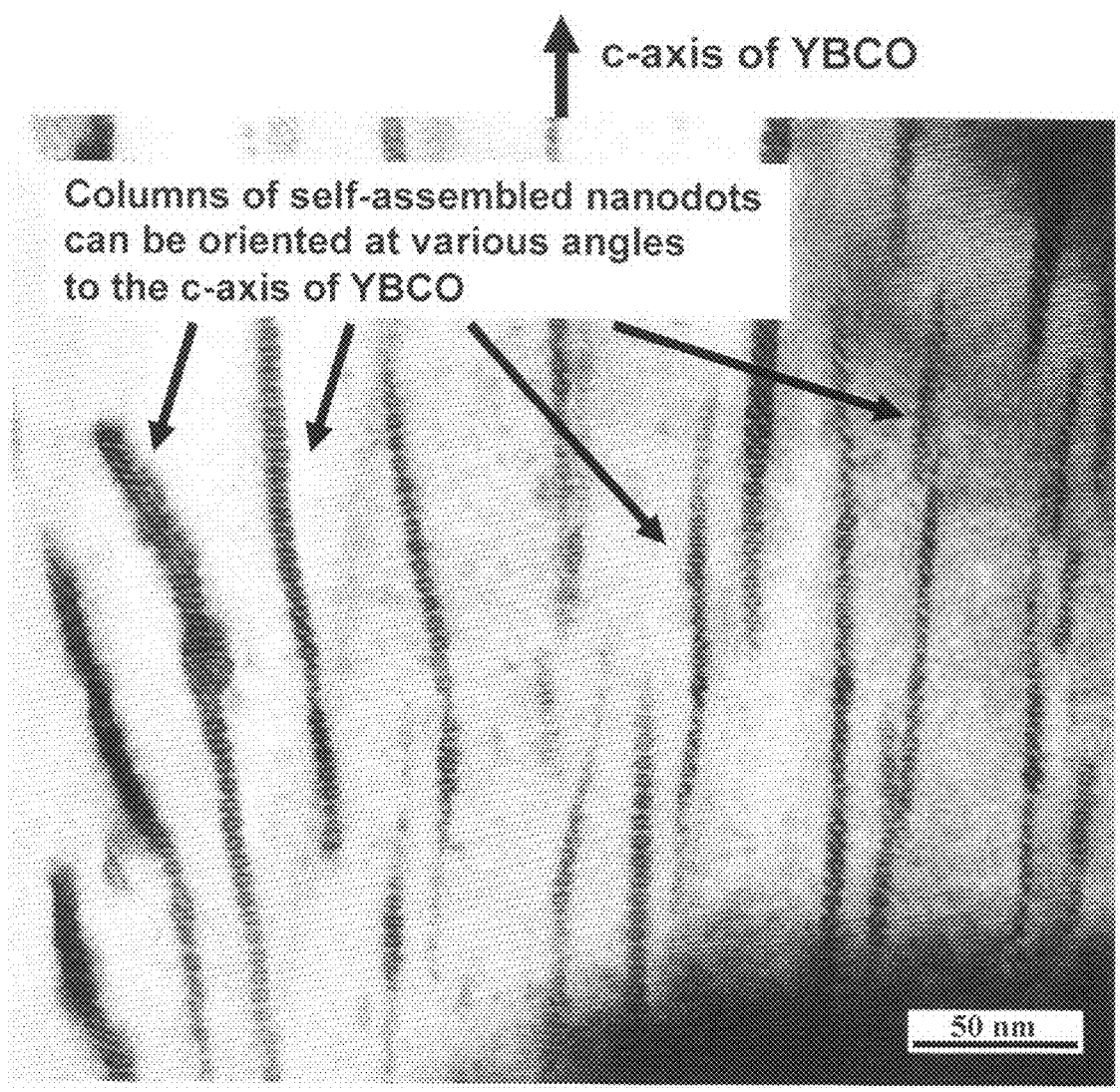
FIG. 14 shows a lower magnification, cross-section, TEM image of a YBCO film with self-assembled nanodots of BZO showing that the columns can be at an angle to the c-axis of YBCO. The columns can also change direction through the thickness of the film. The YBCO film was grown epitaxially on a biaxially textured substrate comprised of Ni-3 at % W with epitaxial buffer layers of $Y_2O_3$/Yttria stabilized zirconia/$CeO_2$.

FIG. 14 shows a cross-section image at low magnification of a thick YBCO with self-assembled nanodots. The figure shows that the columns of self-assembled nanodots of BZO within the YBCO can change direction and become at an angle to the c-axis of YBCO or to the film growth direction. However, all columns are found to be within an angular range of about 60 degrees from the c-axis of the YBCO film. Change in columns direction is also a result of strain minimization. As the film grows, depending on the spatial density of the nanodots, and their relative sizes, columns change direction to minimize the total strain energy in the film. A range of angular directions can be very useful for superconducting applications, since they will be able to pin magnetic flux lines in a range of applied field orientations. The image shown in FIG. 14 is a combination of the idealized schematics shown in FIGS. 1 and 2.

Figure 15:
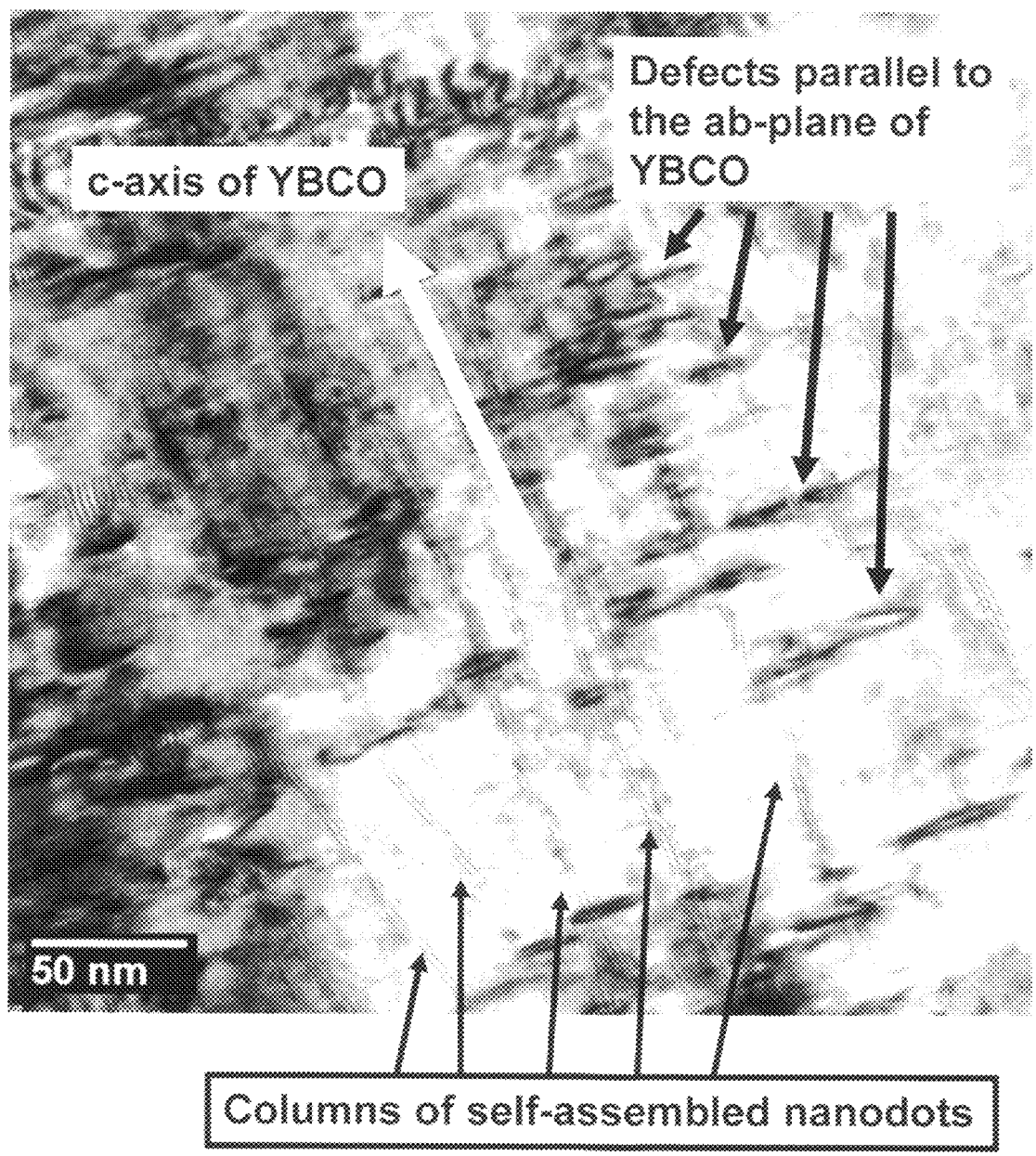
FIG. 15 shows a lower magnification, cross-section, TEM image of another YBCO film with self-assembled nanodots of BZO showing that in addition to columns of self-assembled nanodots, defects parallel to the ab-planes in the YBCO film or perpendicular to the c-axis in YBCO can form. The YBCO film was grown epitaxially on a biaxially textured substrate comprised of Ni-3 at % W with epitaxial buffer layers of $Y_2O_3$/Yttria stabilized zirconia/$CeO_2$.
Figure 16:
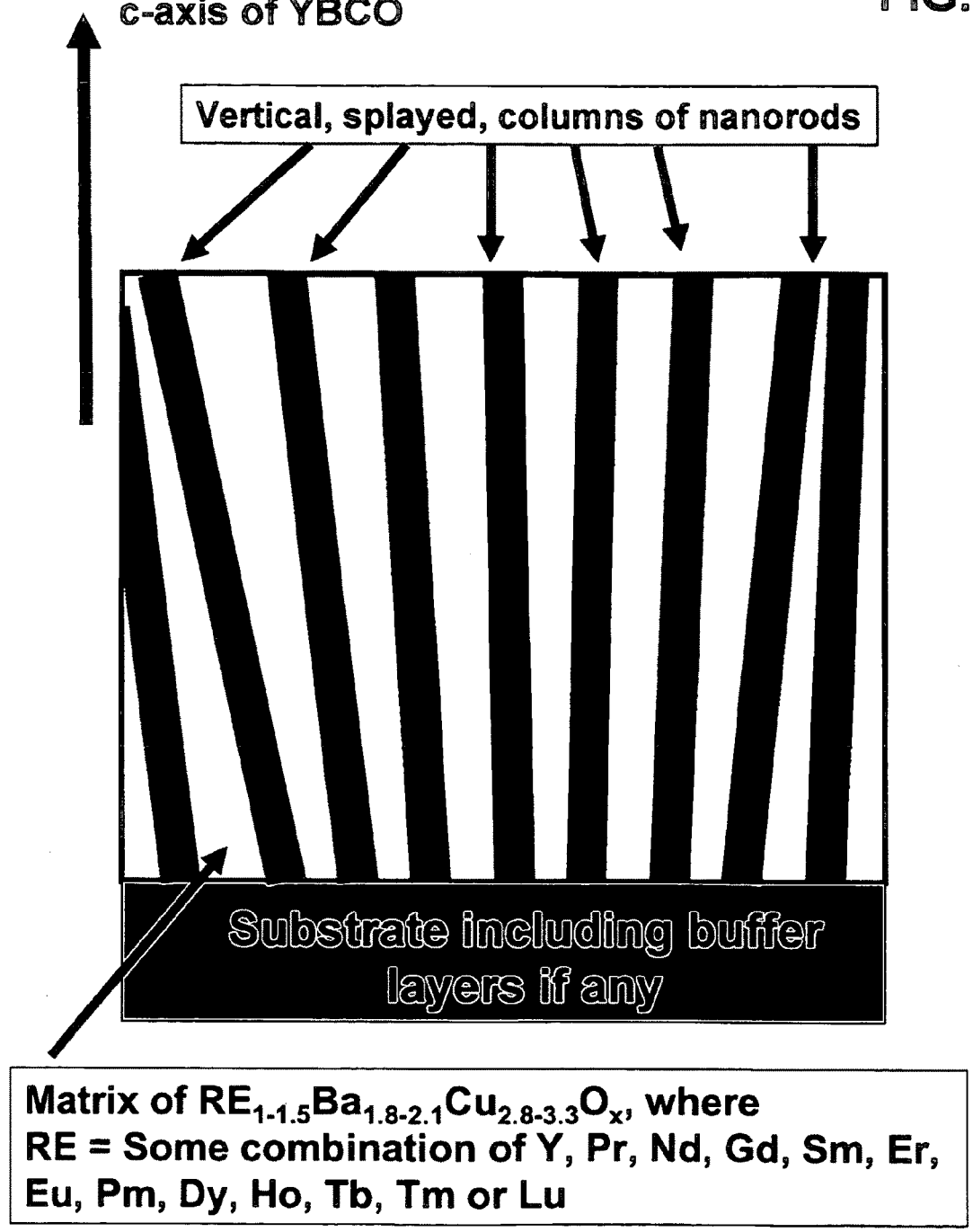
FIG. 16 shows an idealized schematic representation in cross-section of self-assembled or ordered nanorods within a superconducting device layer grown epitaxially on a substrate. In this case the ordering of nanorods occurs such that the nanorods are roughly aligned parallel to the film normal with a spay angle of less than 60°.
Figure 17:
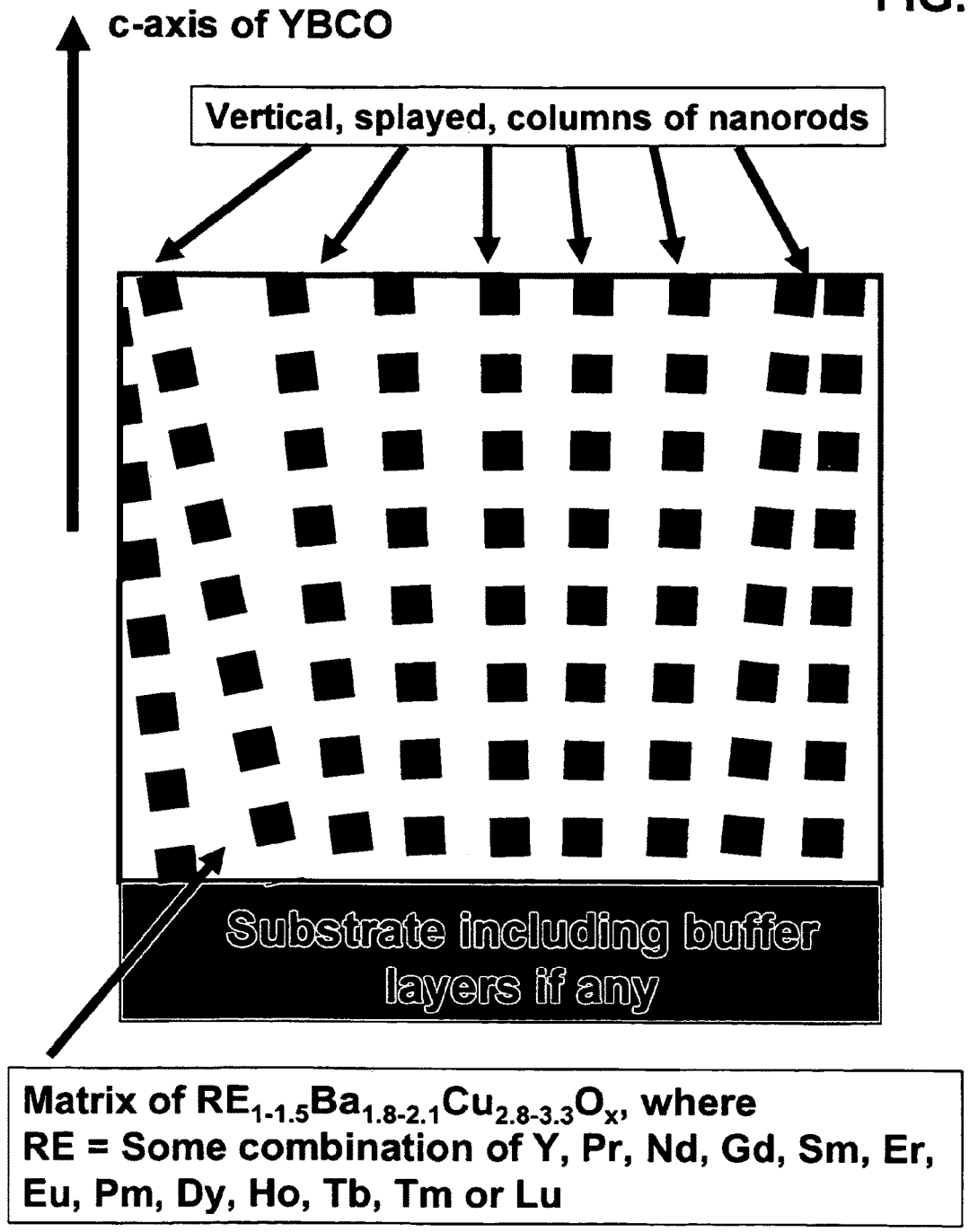
FIG. 17 shows an idealized schematic representation in cross-section of self-assembled or ordered nanodots within a superconducting device layer grown epitaxially on a substrate. In this case the ordering of nanodots occurs such that the nanodots are roughly aligned parallel to the film normal with a spay angle of less than 60°.

FIG. 15 shows a cross-section image at low magnification of another thick YBCO with self-assembled nanodots. This film was grown using different deposition conditions. The figure shows that in addition to the columns of self-assembled nanodots of BZO, defects perpendicular to the c-axis of YBCO can also form. These defects are parallel to the ab-planes in the YBCO film. The presence of defects both parallel to the c-axis of YBCO (self-assembled nanodots of YBCO) as well as defects perpendicular to the c-axis of YBCO, are highly desirable since they will enhance the superconducting properties both when the magnetic field applied is parallel to c-axis and parallel to ab-planes in YBCO. The defects parallel to the ab-planes of YBCO are either horizontal alignment of other second phase nanoparticles and/or stacking faults. This results in an overall enhancement of the superconducting properties at all applied magnetic field orientations. A combination of the features shown in FIGS. 14 and 15 can result in still further improved superconducting properties. FIG. 16 shows an idealized schematic representation in cross-section of self-assembled or ordered nanorods within a superconducting device layer grown epitaxially on a substrate. In this case the ordering of nanorods occurs such that the nanorods are roughly aligned parallel to the film normal with a spay angle of less than 60°. FIG. 17 shows an idealized schematic representation in cross-section of self-assembled or ordered nanodots within a superconducting device layer grown epitaxially on a substrate. In this case the ordering of nanodots occurs such that the nanodots are roughly aligned parallel to the film normal with a spay angle of less than 60°. It is important to note that in most cases, depending on the buffer layer stack used, the orientation of the superconductor is either {100}<100> or a 45-rotated {100}<100>. In most cases this is a in-plane rotation. However one can envision cases such as with a ISD substrate, where the rotation can be about an axis other than the film normal. In general, this invention applies to cases wherein the superconductor layer is rotated or tilted by less than or equal to 45° in all directions and contains the self-assembled, insulating nanodots and nanorods.

While so far all examples have the non-superconducting material as Barium Zirconate wherein nanodots and nanorods of this material which are insulating are incorporated within the superconductor layer, other Barium containing compounds are also of significant interest. These include Barium Titanate, Barium Stanate, Barium Hafnate, Barium Iridium Oxide, Barium Niobate, Barium Aluminate, Barium Cerate, Barium Molybdate, Barium Vanadate and Barium Tungstate. In general, materials of the formula BaMO 3, which is a perovskite oxide containing Ba on the "A" site of standard perovskite with the formula ABO 3. In the formula, BaMO 3, M can be a number of metals such as Ti, Zr, Al, Hf, Ir, Sn, Nb, Mo, Ta, Ce, V, etc. The criteria for selection is a high lattice mismatch of the compound BaMO 3, with respect to the superconductor. The higher the lattice mismatch, the better, because high lattice mismatch results in more strain during epitaxial growth. Minimization of strain results in formation of aligned columns of nanodots or nanorods within the superconductor. Another criteria for selection of the insulating material is limited solubility or reactivity of the BaMO 3 compound with the superconductor. It was previously stated that superconducting films of composition RE 0.8-2.0 Ba 1.5-2.5 Cu 2.5-3.5 O x, where RE refers to some combination of Y, Pr, Nd, Gd, Sm, Er, Eu, Pm, Dy, Ho, Tb, Tm or Lu, were of interest to this application. When preferentially oriented, epitaxial columns of BaMO 3 nanodots or nanorods, are incorporated with the RE 0.8-2.0 Ba 1.5-2.5 Cu 2.5-3.5 O x superconductor, the relevant, macroscopic chemical composition of the film is RE 0.8-2.0 Ba 1.5-2.5 M 0.01-0.2 Cu 2.5-3.5 O x, where M is selected from Ti, Zr, Al, Hf, Ir, Sn, Nb, Mo, Ta, Ce, V and RE is selected from Pr, Nd, Gd, Sm, Er, Eu, Pm, Dy, Ho, Tb, Tm or Lu. For the specific examples shown, RE was Y and M was Zr and the actual chemical composition was close to YBa 2.1 Zr 0.07 Cu 3 O x.

In fact, other oxide compounds which meet these criteria—namely a tendency for limited mixing or reactivity with the superconductor (or result in phase separation) and a high lattice mismatch. Lattice mismatches greater than 3% are preferred. In general, the oxide insulating can have a crystal structure selected from a group comprising a perovskite, rock-salt, pyrochlore or fluorite structure.

Example 3

An epitaxial, composite, superconductor film is fabricated on a biaxially textured substrate IBAD with the self-assembled nanodots and/or of BZO using an in-situ deposition process such as PLD, Sputtering, e-beam co-evaporation or MOCVD deposition. Examination of as-deposited film via electron microscopy shows a columnar structure of BZO, either as columns of aligned, epitaxial nanodots of BZO or aligned nanrods of BZO. Over 80% of the columns are preferentially aligned within 60° of the c-axis of the superconductor. The critical current of superconductor film at 65K, 3 T has a minimum in I c of over than 200 A/cm at all applied field orientations and a J E (min) of greater than 20,000 A/cm 2 at 65K, 3 T at all applied field orientations.

Example 4

An epitaxial, composite, superconductor film is fabricated on a biaxially textured substrate ISD with the self-assembled nanodots and/or of BZO using an in-situ deposition process such as PLD, Sputtering, e-beam co-evaporation or MOCVD deposition. The superconductor film has rotated cube texture. Examination of as-deposited film via electron microscopy shows a columnar structure of BZO, either as columns of aligned, epitaxial nanodots of BZO or aligned nanrods of BZO. Over 80% of the columns are preferentially aligned within 60° of the c-axis of the superconductor. The critical current of superconductor film at 65K, 3 T has a minimum in I c of over than 200 A/cm at all applied field orientations and a J E (min) of greater than 20,000 A/cm 2 at 65K, 3 T at all applied field orientations.

Example 5

An epitaxial composite film is fabricated on a single crystal substrate or a biaxially textured substrate with the self-assembled nanodots being of a photovoltaic material. The matrix can be non-active or not photovoltaic. Further, by varying the deposition conditions during film growth, ordered nanodots of different sizes can be incorporated in the film. Such a film will have excellent photovoltaic properties.

Example 6

An epitaxial composite film is fabricated on a single crystal substrate or a biaxially textured substrate with the self-assembled, ordered nanodots being of a desired magnetic material. The matrix is non-magnetic thereby providing a magnetic barrier around each nanodot. Further, by varying the deposition conditions during film growth, ordered nanodots of different sizes can be incorporated in the film. Such a film will have excellent properties and be suitable for ultra high density storage applications. Such films can have outstanding physical properties such as giant magnetoresistance, superparamagnetism, large coercivities, high Curie temperature and low magnetization saturation as compared to corresponding bulk values. Due to the realization of these outstanding physical properties upon size reduction via incorporation of self-assembled magnetic nanodots and nanorods within a crystalline, non-magnetic matrix could bring out revolutionary advances in applications. In this example having a matrix with different magnetic properties is also possible and will also lead to novel properties.

Magnetic oxide perovskites are well known due to the phenomenon of colossal magnetoresistance (CMR) found in these materials. The 100% spin-polarization of half-metallic magnetic perovskites and the ability to epitaxially incorporate them into self-assembled nanodots within single crystal all-oxide film heterostructures will be very important in spintronics applications.

For other electronic devices, an ordered array of three dimensional nanodots and nanorods promises to extend device physics to full two- or three-dimensional confinement (quantum wires and dots). Multidimensional confinement in these low dimensional structures has long been predicted to alter significantly the transport and optical properties, compared to bulk or planar heterostructures. More recently, the effect of charge quantization on transport in small semiconductor quantum dots has stimulated much research in single-electron devices, in which the transfer of a single electron is sufficient to control the device. The most important factor driving active research in quantum effect is the rapidly expanding semiconductor band-gap engineering capability provided by modern epitaxy, Possible applications include spin transistors and single electron transistors. Other possible applications of three dimensionally ordered nanodots and nanorods include potential applications in optoelectronics and sensors. For example, an array of luminescent ordered nanodots within a transparent matrix can be used for devices using the photoluminescence effect.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. A composition of matter comprising a superconducting film of overall composition RE0.8-2.0Ba1.5-2.5M0.01-0.2Cu2.5-3.5Ox, where M is selected from Ti, Zr, Al, Hf, Ir, Sn, Nb, Mo, Ta, Ce or V and RE is selected from Y, Pr, Nd, Gd, Sm, Er, Eu, Pm, Dy, Ho, Tb, Tm or Lu;

wherein M forms an oxide compound that results in epitaxial, non-superconducting, columnar defects within the superconducting film oriented along the c-axis of the superconductor;

wherein said superconducting film further having crystalline defects aligned perpendicular to the c-axis of the superconductor and with the resulting superconducting film characterized by enhanced flux-pinning.

2. The composition of claim 1 wherein over 80% of said crystalline defects aligned perpendicular to the c-axis of the superconductor are aligned within ±15 degrees from the perpendicular to the c-axis.

3. The composition of claim 1 wherein over 80% of said epitaxial, non-superconducting, columnar defects are aligned within 60 degrees from the c-axis of superconductor.

4. The composition of claim 1 wherein said crystalline defects aligned perpendicular to the c-axis of the superconductor are comprised of stacking faults, RE oxides or Cu oxides.

5. The composition of claim 1 wherein said non-superconducting columnar defects within the superconductor layer are composed of a crystalline barium oxide compound containing two or more cations, with one of the cations from a group consisting of Ti, Zr, Al, Hf, Ir, Sn, Nb, Mo, Ta, Ce and V.

6. The composition of claim 1 further comprising non-superconducting material within the superconducting layer which is randomly or non-epitaxially oriented with respect to the superconductor layer.

7. The composition of claim 1, wherein said superconducting layer has an orientation of {100}<100> or a rotated {100}<100>, with a rotation of less than or equal 45 degrees.

8. The composition of claim 1, wherein said superconducting layer has a total engineering critical current density in excess of 20,000 Amperes/cm$^2$ at 65K, in an applied magnetic field of 3 T, and in all applied field orientations.

9. A composition of matter comprising a superconducting film of overall composition RE0.8-2.0Ba1.5-2.5M0.01-0.2Cu2.5-3.5Ox, where M is selected from Ti, Zr, Al, Hf, Ir, Sn, Nb, Mo, Ta, Ce or V and RE is selected from Y, Pr, Nd, Gd, Sm, Er, Eu, Pm, Dy, Ho, Tb, Tm or Lu;
   wherein M forms an oxide compound that results in epitaxial, non-superconducting, columnar defects within the superconducting film oriented along the c-axis of the superconductor;
   wherein said superconducting film further having crystalline defects aligned perpendicular to the superconductor film normal and with the resulting superconducting film characterized by enhanced flux-pinning.

10. The composition of claim 9 wherein over 80% of said crystalline defects aligned perpendicular to the superconductor film normal are aligned within ±15 degrees from the perpendicular to the film normal.

11. The composition of claim 9 wherein over 80% of said epitaxial, non-superconducting, columnar defects are aligned within 60 degrees from the c-axis of superconductor.

12. The composition of claim 9 wherein said crystalline defects aligned perpendicular to the c-axis of the superconductor are stacking faults, RE oxides or Cu oxides.

13. The composition of claim 9 further comprising non-superconducting material within the superconducting layer which is randomly or non-epitaxially oriented with respect to the superconductor layer.

14. The composition of claim 9 wherein said non-superconducting columnar defects within the superconductor layer are composed of a crystalline barium oxide compound containing two or more cations, with one of the cations from a group consisting of Ti, Zr, Al, Hf, Ir, Sn, Nb, Mo, Ta, Ce and V.

15. The composition of claim 9, wherein said superconducting layer has an orientation of {100}<100> or a rotated {100}<100>, with a rotation of less than or equal 45 degrees.

16. The composition of claim 9, wherein said superconducting layer has a total engineering critical current density in excess of 20,000 Amperes/cm$^2$ at 65K, in an applied magnetic field of 3 T, and in all applied field orientations.

17. A composition of matter comprising a superconducting film of overall composition RE0.8-2.0Ba1.5-2.5M0.01-0.2Cu2.5-3.5Ox;
   wherein M is selected from Ti, Zr, Al, Hf, Ir, Sn, Nb, Mo, Ta, Ce or V and RE is selected from Y, Pr, Nd, Gd, Sm, Er, Eu, Pm, Dy, Ho, Tb, Tm or Lu;
   wherein M forms epitaxial, non-superconducting, columnar defects within the superconducting film such that over 80% of the columnar defects are aligned within 60 degrees along the c-axis of the superconductor;
   wherein said epitaxial, non-superconducting, columnar defects within the superconducting film are an alloy of M, Ba and O;
   wherein said superconducting film further has crystalline defects aligned perpendicular to the c-axis of the superconductor such that over 80% of the defects are aligned within ±15 degrees from the perpendicular to the c-axis of the superconductor;
   wherein said superconducting film is characterized by enhanced flux-pinning.

18. The composition of claim 17 wherein said crystalline defects aligned perpendicular to the c-axis are selected from a group consisting of stacking faults, RE oxides and Cu oxides.

19. The composition of claim 17 wherein said non-superconducting columnar defects within the superconductor film oriented within 60 degrees of the c-axis of the superconductor have a chemical formula of BaMO$_3$, where M is selected from a group consisting of Ti, Zr, Al, Hf, Ir, Sn, Nb, Mo, Ta, Ce and V.

20. The composition of claim 17 further comprising non-superconducting material within the superconducting layer which is randomly or non-epitaxially oriented with respect to the superconductor layer.

21. The composition of claim 17, wherein said superconducting layer has an orientation of {100}<100> or a rotated {100}<100>, with a rotation of less than or equal 45 degrees.

22. The composition of claim 17, wherein said superconducting layer has a total engineering critical current density in excess of 20,000 Amperes/cm$^2$ at 65K, in an applied magnetic field of 3 T, and in all applied field orientations.

23. The composition of claim 17 wherein said non-superconducting columnar defects within the superconductor film oriented within 60 degrees of the c-axis of the superconductor layer is a crystalline barium oxide compound containing two or more cations, with one of the cations selected from a group consisting of Ti, Zr, Al, Hf, Ir, Sn, Nb, Mo, Ta, Ce and V.

24. A composition of matter comprising a superconducting film of overall composition RE0.8-2.0Ba1.5-2.5M0.01-0.2Cu2.5-3.5Ox,
   wherein M is selected from Ti, Zr, Al, Hf, Ir, Sn, Nb, Mo, Ta, Ce or V and RE is selected from Y, Pr, Nd, Gd, Sm, Er, Eu, Pm, Dy, Ho, Tb, Tm or Lu;
   wherein M forms epitaxial, non-superconducting, columnar defects within the superconducting film such that over 80% of the columnar defects are aligned within 60 degrees to the normal to the superconductor film;
   wherein said epitaxial, non-superconducting, columnar defects within the superconducting film are an alloy of M, Ba and O;
   wherein said superconducting film further has crystalline defects aligned perpendicular to the normal to the superconductor such that over 80% of the defects are aligned within ±15 degrees from the perpendicular to the normal to the superconductor film;
   wherein said superconducting film is characterized by enhanced flux-pinning.

25. The composition of claim 24 wherein said crystalline defects aligned perpendicular to the normal to the superconducting film are selected from a group consisting of stacking faults, RE oxides and Cu oxides.

26. The composition of claim 24 wherein said non-superconducting columnar defects within the superconductor film oriented within 60 degrees of the normal to the superconductor film have a chemical formula of $BaMO_3$, where M is selected from a group consisting of Ti, Zr, Al, Hf, Ir, Sn, Nb, Mo, Ta, Ce and V.

27. The composition of claim 24 further comprising non-superconducting material within the superconducting layer which is randomly or non-epitaxially oriented with respect to the superconductor layer.

28. The composition of claim 24, wherein said superconducting layer has an orientation of {100}<100> or a rotated {100}<100>, with a rotation of less than or equal 45 degrees.

29. The composition of claim 24, wherein said superconducting layer has a total engineering critical current density in excess of 20,000 Amperes/$cm^2$ at 65K, in an applied magnetic field of 3 T, and in all applied field orientations.

30. The composition of claim 24 wherein said non-superconducting columnar defects within the superconductor film oriented within 60 degrees of the normal to the superconductor film is a crystalline barium oxide compound containing two or more cations, with one of the cations selected from a group consisting of Ti, Zr, Al, Hf, Ir, Sn, Nb, Mo, Ta, Ce and V.

* * * * *